US012183557B2

(12) United States Patent
Cui et al.

(10) Patent No.: US 12,183,557 B2
(45) Date of Patent: *Dec. 31, 2024

(54) APPARATUS AND METHODS FOR CONTROLLING ION ENERGY DISTRIBUTION

(71) Applicant: Applied Materials, Inc., Santa Clara, CA (US)

(72) Inventors: Linying Cui, Cupertino, CA (US); James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/244,544

(22) Filed: Sep. 11, 2023

(65) Prior Publication Data

US 2023/0420229 A1    Dec. 28, 2023

Related U.S. Application Data

(63) Continuation of application No. 17/099,342, filed on Nov. 16, 2020, now Pat. No. 11,798,790.

(51) Int. Cl.
*H01J 37/32* (2006.01)
(52) U.S. Cl.
CPC .. *H01J 37/32697* (2013.01); *H01J 37/32715* (2013.01)
(58) Field of Classification Search
CPC ............. H01J 37/32697; H01J 37/32715
See application file for complete search history.

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 101990353 A | 3/2011 |
| CN | 102084024 A | 6/2011 |

(Continued)

OTHER PUBLICATIONS

Taiwanese Patent Application No. 110140681 Office Action dated Nov. 21, 2023.

(Continued)

*Primary Examiner* — David A Vanore
(74) *Attorney, Agent, or Firm* — Patterson + Sheridan, LLP

(57) ABSTRACT

Embodiments of the present disclosure generally relate to apparatus and methods for controlling an ion energy distribution during plasma processing. In an embodiment, the apparatus includes a substrate support that has a body having a substrate electrode for applying a substrate voltage to a substrate, and an edge ring electrode embedded for applying an edge ring voltage to an edge ring. The apparatus further includes a substrate voltage control circuit coupled to the substrate electrode, and an edge ring voltage control circuit coupled to the edge ring electrode. The substrate electrode, edge ring electrode, or both are coupled to a power module configured to actively control an energy distribution function width of ions reaching the substrate, edge ring, or both. Methods for controlling an energy distribution function width of ions during substrate processing are also described.

21 Claims, 14 Drawing Sheets

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |

(56) References Cited

U.S. PATENT DOCUMENTS

| | | |
|---|---|---|
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |

(56) References Cited

U.S. PATENT DOCUMENTS

| | | |
|---|---|---|
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 * | 6/2019 | Dorf ................ H01J 37/08 |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 * | 10/2019 | Dorf ................ H01J 37/3426 |
| 10,448,495 B1 * | 10/2019 | Dorf ................ H05H 1/46 |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 * | 2/2020 | Dorf ................ H01J 37/3444 |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 * | 6/2020 | Dorf ................ H01J 37/32715 |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 * | 2/2021 | Dorf ................ H01J 37/32174 |
| 10,923,320 B2 | 2/2021 | Koh et al. |
| 10,923,321 B2 * | 2/2021 | Dorf ................ H01J 37/32128 |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,069,504 B2 * | 7/2021 | Dorf ................ H01J 37/248 |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 11,284,500 B2 * | 3/2022 | Dorf ................ H01J 37/3426 |
| 11,462,389 B2 * | 10/2022 | Dorf ................ H01J 37/32568 |
| 11,476,145 B2 * | 10/2022 | Rogers ................ H01J 37/248 |
| 11,508,554 B2 * | 11/2022 | Mishra ............ H01L 21/67103 |
| 11,694,876 B2 * | 7/2023 | Rogers ............ H01J 37/32091 438/714 |
| 11,699,572 B2 * | 7/2023 | Dorf ................ H01J 37/32174 323/371 |
| 11,728,124 B2 * | 8/2023 | Dorf ................ H01J 37/32706 250/492.21 |
| 11,798,790 B2 * | 10/2023 | Cui ................ H01J 37/32715 |
| 11,901,157 B2 * | 2/2024 | Cui ................ C23C 16/4586 |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Amet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |

(56) References Cited

U.S. PATENT DOCUMENTS

| | | |
|---|---|---|
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Surin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0003501 A1* | 1/2013 | Marquez ............... G01M 3/18 367/83 |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |

(56) References Cited

U.S. PATENT DOCUMENTS

| | | |
|---|---|---|
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157043 A1 | 5/2019 | Shaw et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234921 A1 | 7/2020 | Dorf et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2022/0157561 A1* | 5/2022 | Cui ............ C23C 16/507 |
| 2022/0157577 A1* | 5/2022 | Cui ............ H01J 37/32715 |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2096679 A1 | 9/2009 |
| EP | 2221614 A1 | 8/2010 |
| EP | 2407998 A1 | 1/2012 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 2004193564 A | 7/2004 |
| JP | 4418424 B2 | 2/2010 |
| JP | 2011035266 A | 2/2011 |
| JP | 5018244 B2 | 9/2012 |

(56) References Cited

FOREIGN PATENT DOCUMENTS

| | | |
|---|---|---|
| JP | 2014112644 A | 6/2014 |
| JP | 2016-225439 A | 12/2016 |
| JP | 2018195588 A | 12/2018 |
| JP | 2019523993 A | 8/2019 |
| JP | 2019197892 A | 11/2019 |
| JP | 2020501351 A | 1/2020 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 201312622 A | 3/2013 |
| TW | 201717247 A | 5/2017 |
| TW | 201801224 A | 1/2018 |
| TW | 201933422 A | 8/2019 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2020216741 A1 | 10/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Notice of Allowance from JP Patent Application No. 2023-503137 dated Mar. 12, 2024, with translation.

Wang, S.B., et al.—"Control of ion energy distribution at substrates during plasma processing," Journal of Applied Physics, vol. 88, No. 2, Jul. 15, 2000, pp. 643-646.

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"In Situ Testing of EHT Integrators on a Tokamak," 2015, 1 page.

Eagle Harbor Technologies webpage—High Gain and Frequency Ultra-Stable Integrators for Long Pulse and/or High Current Applications, 2018, 1 page.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Semiconductor Components Industries, LLC (SCILLC)—"Switch-Mode Power Supply" Reference Manual, SMPSRM/D, Rev. 4, Apr. 2014, ON Semiconductor, 73 pages.

PCT International Search Report and Written Opinion dated Nov. 9, 2018, for International Application No. PCT/US2018/043032.

(56) References Cited

OTHER PUBLICATIONS

Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, etal.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, "Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With a DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 Mar. 24, 2022.
Taiwanese office action dated May 30, 2024 for Application No. 110140681.
Japanese Office Action dated Apr. 9, 2024 for Application No. 2023-503136.
European Search Report dated Sep. 30, 2024 re: EP Patent Application No. 21892541.0.
European Search Report for Application No. 21892542.8 dated Sep. 30, 2024.

* cited by examiner

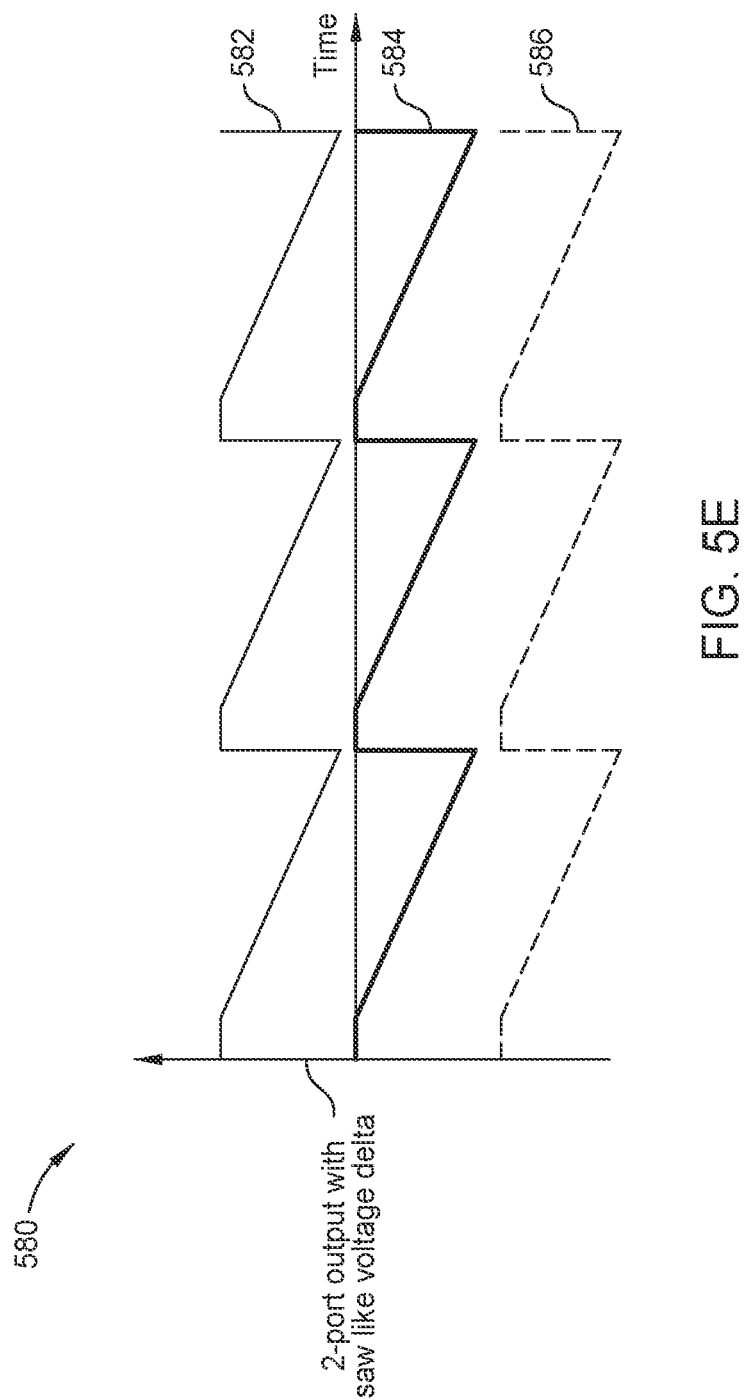

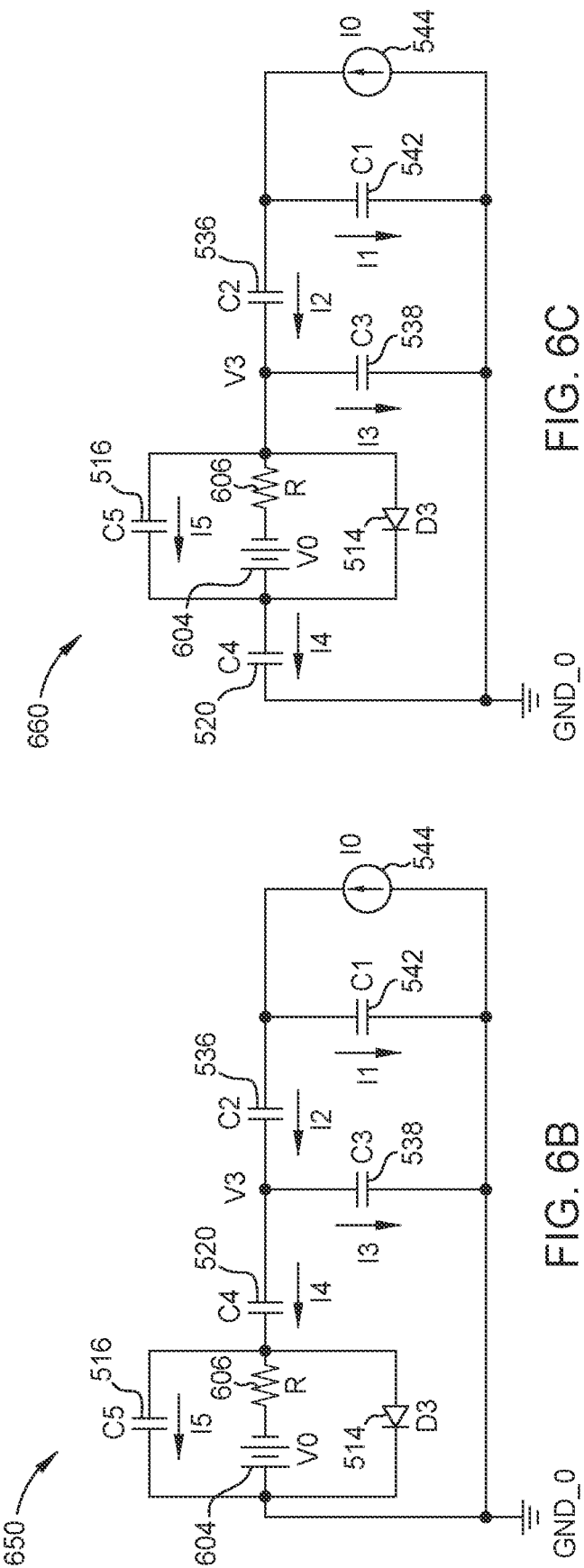

APPARATUS AND METHODS FOR CONTROLLING ION ENERGY DISTRIBUTION

CROSS-REFERENCE TO RELATED APPLICATIONS

This application is a continuation of U.S. patent application Ser. No. 17/099,342, filed on Nov. 16, 2020, which is incorporated herein by reference in its entirety.

BACKGROUND

Field

Embodiments of the present disclosure generally relate to apparatus and methods for plasma processing of a substrate, and specifically to apparatus and methods for controlling an ion energy distribution during plasma processing.

Description of the Related Art

During plasma processing of a substrate, ions play a key role for substrate surface treatment, etching, and deposition. Ions impinging the substrate surface can have a variety of energies which is described by an ion energy distribution function (IEDF). Control over the IEDF can be an important factor for various substrate processing schemes. Controlling the IEDF, however, remains a challenge. For example, when periodic alternating voltage is applied to electrode(s) of a chamber, a plasma sheath can develop above the substrate. The ions flowing towards the substrate are accelerated by the plasma sheath voltage which correlates with the voltage applied to the electrode. At the same time, ion current can charge the substrate and alter the substrate potential, which in turn affects the plasma sheath voltage such that the IEDF at the substrate surface is also affected, e.g., broadened. State-of-the-art methods to control the IEDF in such instances, and others, are based on inefficient iteration loops.

There is a need for new and improved methods for controlling the IEDF.

SUMMARY

Embodiments of the present disclosure generally relate to apparatus and methods for plasma processing of a substrate, and specifically to apparatus and methods for controlling an ion energy distribution during plasma processing.

In an embodiment, a method of controlling an ion energy distribution function (IEDF) is provided. The method includes introducing a voltage to an electrode of a processing chamber by activating a main pulser, the main pulser coupled to an IEDF width control module, and measuring a current of the IEDF width control module and a voltage or a voltage derivative of the IEDF width control module. The method further includes calculating an ion current of the processing chamber and a capacitance of the processing chamber based on the current and the voltage or voltage derivative of the IEDF width control module. The method further includes determining a setpoint for a DC voltage of the main pulser, a setpoint for a voltage or a voltage derivative of the IEDF width control module, or both, and adjusting the DC voltage of the main pulser, the voltage or voltage derivative of the IEDF width control module, or both, to the determined setpoints to control the width of the IEDF.

In another embodiment, an apparatus for controlling an ion energy distribution is provided. The apparatus includes a substrate support that has a body having a substrate support portion having a substrate electrode embedded therein for applying a substrate voltage to a substrate. The body further includes an edge ring portion disposed adjacent to the substrate support portion, the edge ring portion having an edge ring electrode embedded therein for applying an edge ring voltage to an edge ring. The apparatus further includes a substrate voltage control circuit coupled to the substrate electrode and an edge ring voltage control circuit coupled to the edge ring electrode. The substrate electrode is coupled to a power module configured to actively control an energy distribution function width of ions reaching the substrate, or the edge ring electrode is coupled to a power module configured to actively control an energy distribution function width of ions reaching the edge ring, or a combination thereof. The substrate voltage control circuit, the edge ring voltage control circuit, or both comprises a main pulser coupled to a current return path, the current return path coupled to the power module and to a processing chamber, wherein the power module comprises a voltage source, a current source, or a combination thereof In another embodiment, an apparatus for controlling an ion energy distribution is provided. The apparatus includes a substrate support that has a body having a substrate support portion having a substrate electrode embedded therein for applying a substrate voltage to a substrate. The body further includes an edge ring portion disposed adjacent to the substrate support portion, the edge ring portion having an edge ring electrode embedded therein for applying an edge ring voltage to an edge ring. The apparatus further includes a substrate voltage control circuit coupled to the substrate electrode and an edge ring voltage control circuit coupled to the edge ring electrode. The substrate electrode is coupled to a power module configured to actively control an energy distribution function width of ions reaching the substrate, or the edge ring electrode is coupled to a power module configured to actively control an energy distribution function width of ions reaching the edge ring, or a combination thereof. The substrate voltage control circuit, the edge ring voltage control circuit, or both comprises a main pulser coupled to the power module, the power module coupled to a processing chamber, the power module comprising a voltage source, a current source, or a combination thereof.

In another embodiment, an apparatus for controlling an ion energy distribution is provided. The apparatus includes a substrate support that has a body having a substrate support portion having a substrate electrode embedded therein for applying a substrate voltage to a substrate. The body further includes an edge ring portion disposed adjacent to the substrate support portion, the edge ring portion having an edge ring electrode embedded therein for applying an edge ring voltage to an edge ring. The apparatus further includes a substrate voltage control circuit coupled to the substrate electrode and an edge ring voltage control circuit coupled to the edge ring electrode. The substrate electrode is coupled to a power module configured to actively control an energy distribution function width of ions reaching the substrate, or the edge ring electrode is coupled to a power module configured to actively control an energy distribution function width of ions reaching the edge ring, or a combination thereof. The substrate voltage control circuit, the edge ring voltage control circuit, or both comprises a main pulser coupled to the power module, the power module coupled to a processing chamber, wherein the power module is in parallel with a substrate chucking and bias compensation module, and wherein the power module comprises a voltage source, a current source, or a combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

FIG. 5E shows exemplary saw-shaped voltage outputs according to at least one embodiment of the present disclosure.

FIG. 6B is an example control circuit according to at least one embodiment of the present disclosure.

FIG. 6C is an example control circuit according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
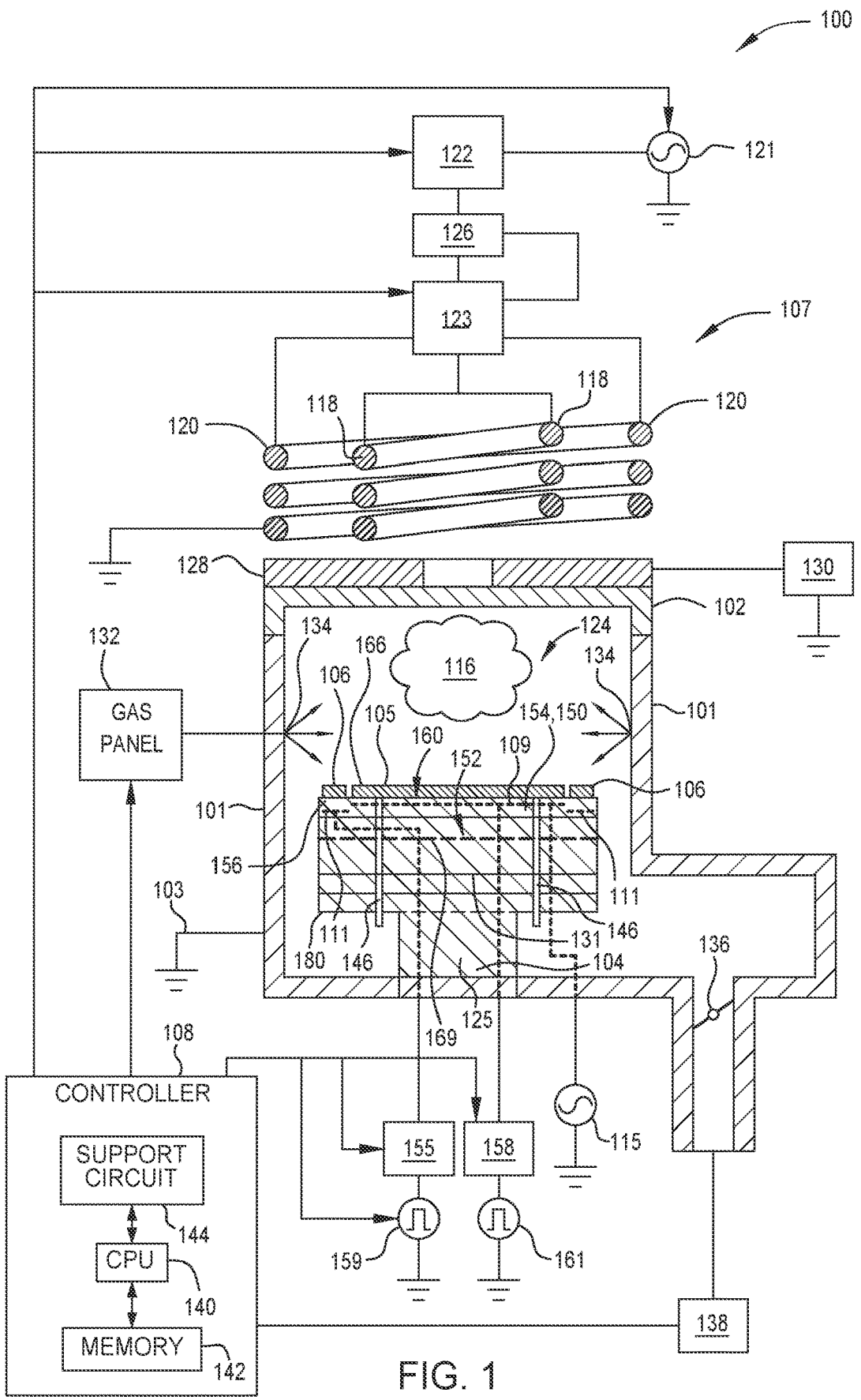
FIG. 1 is a schematic sectional view of an example processing chamber according to at least one embodiment of the present disclosure.

Embodiments of the present disclosure generally relate to apparatus and methods for plasma processing of a substrate, and specifically to apparatus and methods for controlling an ion energy distribution during plasma processing. The methods and apparatus, e.g., circuits, described herein enable control over the shape (e.g., narrow, or adjustable width) of the voltage waveform of a pulsed DC power supply. Embodiments described herein further enable, e.g., control over the ion energy distribution function (IEDF) including monoenergetic ion acceleration.

The IEDF is a parameter for etching high aspect ratio features. Typically, pulsed DC biases can provide a narrower IEDF as compared to sine wave RF biases according to the following mechanism. Because ions are accelerated by a less time-varying electric field within a pulsed DC period, the energy gained by the ions within the sheath also exhibits a lower time variance than when varying sine wave RF bias. As a result, ions accelerated by the pulsed DC bias have a narrower IEDF than sine wave RF bias. However, an ion current from the bulk plasma to the substrate distorts the voltage waveform at the substrate and broadens the ion energy distribution. Methods and apparatus described herein can, e.g., compensate this ion current and actively control the width of the ion energy distribution.

Conventional methods and apparatus use an iteration control loop to control the width of the ion energy distribution. Before convergence of the control algorithm, estimation of the plasma parameters (e.g., ion current, sheath thickness, and IEDF width) are inaccurate. Moreover, controlling the width of the IEDF by using iterations is slow and can result in non-convergence of the control algorithm.

In contrast, the methods and apparatus described herein utilize one loop, without iteration, to determine the ion current and the compensation current to achieve a given IEDF width. Accordingly, the methods and apparatus described herein reach a desired state of the IEDF, e.g., a narrow IEDF, faster than the state-of-the-art. This is due to, e.g., not using an iteration in determining the solution of the compensation current.

Briefly, and in some embodiments, a substrate support includes a body, the body including a substrate support portion and/or an edge ring portion. A substrate electrode is embedded in the substrate support portion for applying a substrate voltage to a substrate. A substrate voltage control circuit is coupled to the substrate electrode. The edge ring portion includes an edge ring electrode embedded therein for applying an edge ring voltage to an edge ring. An edge ring voltage control circuit is coupled to the edge ring electrode. At least one shaped DC pulse source is coupled to the substrate voltage control circuit and/or the edge ring voltage control circuit. The substrate voltage circuit and/or the edge ring voltage control circuit is tunable. Adjustment of the voltage amplitude via, e.g., tuning the substrate voltage control circuit and/or the edge ring voltage control circuit results in adjustment and control of the ion energy distribution.

In some embodiments, a control circuit of the IEDF width is coupled to the substrate support. The control circuit of the IEDF width can be integrated inside a main pulsed DC power supply, or as a separate module, or as an integrated module with a bias compensation module.

Example Processing System Configurations

FIG. 1 is a schematic sectional view of a processing chamber 100 according to at least one embodiment of the present disclosure. The processing chamber 100 is configured to practice the schemes described herein. In this embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber.

The processing chamber 100 includes a chamber body 101 and a lid 102 disposed thereon that together define an internal volume 124. The chamber body 101 is typically coupled to an electrical ground 103. A substrate support assembly 104 is disposed within the inner volume to support a substrate 105 thereon during processing. An edge ring 106 is positioned on the substrate support assembly 104 and surrounds the periphery of the substrate 105. The processing chamber 100 also includes an inductively coupled plasma apparatus 107 for generating a plasma of reactive species within the processing chamber 100, and a controller 108 adapted to control systems and subsystems of the processing chamber 100. In some embodiments, the inductively coupled plasma apparatus 107 can be replaced by a grounded shower head and RF power is delivered from an electrode underneath the substrate to generate capacitively coupled plasma.

The substrate support assembly 104 is disposed in the internal volume 124. The substrate support assembly 104 generally includes a substrate support 152. The substrate support 152 includes an electrostatic chuck 150 comprising a substrate support portion 154 configured to underlay and support the substrate 105 to be processed and an edge ring portion 156 configured to support an edge ring 106. The substrate support assembly 104 can additionally include a heater assembly 169. The substrate support assembly 104 can also include a cooling base 131. The cooling base 131 can alternately be separate from the substrate support assembly 104. The substrate support assembly 104 can be removably coupled to a support pedestal 125. The support pedestal 125 is mounted to the chamber body 101. The support pedestal 125 can optionally include a facility plate 180. The substrate support assembly 104 may be periodically removed from the support pedestal 125 to allow for refurbishment of one or more components of the substrate support assembly 104. Lifting pins 146 are disposed through the substrate support assembly 104 as conventionally known to facilitate substrate transfer.

The facility plate 180 is configured to accommodate a plurality of fluid connections from the electrostatic chuck 150 and the cooling base 131. The facility plate 180 is also configured to accommodate the plurality of electrical connections from the electrostatic chuck 150 and the heater assembly 169. The plurality of electrical connections can run externally or internally of the substrate support assembly 104, while the facility plate 180 provides an interface for the connections to a respective terminus.

A substrate electrode 109 is embedded within the substrate support portion 154 of the electrostatic chuck 150 for applying a substrate voltage to a substrate 105 disposed on an upper surface 160 of the substrate support assembly 104. The edge ring portion 156 has an edge ring electrode 111 embedded therein for applying an edge ring voltage to the edge ring 106. An edge ring IEDF width control circuit 155 is coupled to the edge ring electrode 111. A substrate IEDF width control circuit 158 is coupled to the substrate electrode 109. In one embodiment, a first shaped DC pulse voltage source 159 is coupled to one or both of the edge ring IEDF width control circuit 155 and the substrate IEDF width control circuit 158. In another embodiment, as shown in FIG. 1, the first shaped DC voltage source 159 is coupled to the edge ring IEDF width control circuit 155 and a second shaped DC voltage source 161 is coupled to the substrate IEDF width control circuit 158. The edge ring IEDF width control circuit 155 and the substrate IEDF width control circuit 158 are independently tunable. The substrate electrode 109 is further coupled to a chucking power source 115 to facilitate chucking of the substrate 105 to the upper surface 160 with the electrostatic chuck 150 during processing.

The inductively coupled plasma apparatus 107 is disposed above the lid 102 and is configured to inductively couple RF power to gases within the processing chamber 100 to generate a plasma 116. The inductively coupled plasma apparatus 107 includes first coil 118 and second coil 120 disposed above the lid 102. The relative position, ratio of diameters of each coil 118, 120, and/or the number of turns in each coil 118, 120 can each be adjusted as desired to control the profile or density of the plasma 116 being formed. Each of the first and second coils 118, 120 is coupled to an RF power supply 121 through a matching network 122 via an RF feed structure 123. The RF power supply 121 can illustratively be capable of producing up to about 4000 W (but not limited to about 4000 W) at a tunable frequency in a range from 50 kHz to 13.56 MHz, although other frequencies and powers can be utilized as desired for particular applications.

In some examples, a power divider 126, such as a dividing capacitor, can be provided between the RF feed structure 123 and the RF power supply 121 to control the relative quantity of RF power provided to the respective first and second coils 118, 120. In other embodiments, a capacitively coupled plasma apparatus (not shown) can be used above the lid 102. A heater element 128 can be disposed on the lid 102 to facilitate heating the interior of the processing chamber 100. The heater element 128 can be disposed between the lid 102 and the first and second coils 118, 120. In some examples, the heater element 128 includes a resistive heating element and is coupled to a power supply 130, such as an AC power supply, configured to provide sufficient energy to control the temperature of the heater element 128 within a desired range.

During operation, the substrate 105, such as a semiconductor substrate or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the internal volume 124 of the chamber body 101. The process gases are ignited into a plasma 116 in the processing chamber 100 by applying power from the RF power supply 121 to the first and second coils 118, 120. The pressure within the internal volume 124 of the processing chamber 100 can be controlled using a valve 136 and a vacuum pump 138.

The processing chamber 100 includes the controller 108 to control the operation of the processing chamber 100 during processing. The controller 108 comprises a central processing unit (CPU) 140, a memory 142, and support circuits 144 for the CPU 140 and facilitates control of the components of the processing chamber 100. The controller 108 can be one of any form of general-purpose computer processor that can be used in an industrial setting for controlling various chambers and sub-processors. The memory 142 stores software (source or object code) that can be executed or invoked to control the operation of the processing chamber 100 in the manner described herein. The controller 108 is configured to control the first shaped DC voltage source 159, the second shaped DC voltage source 161, the edge ring IEDF width control circuit 155, and the substrate IEDF width control circuit 158.

Figure 2:
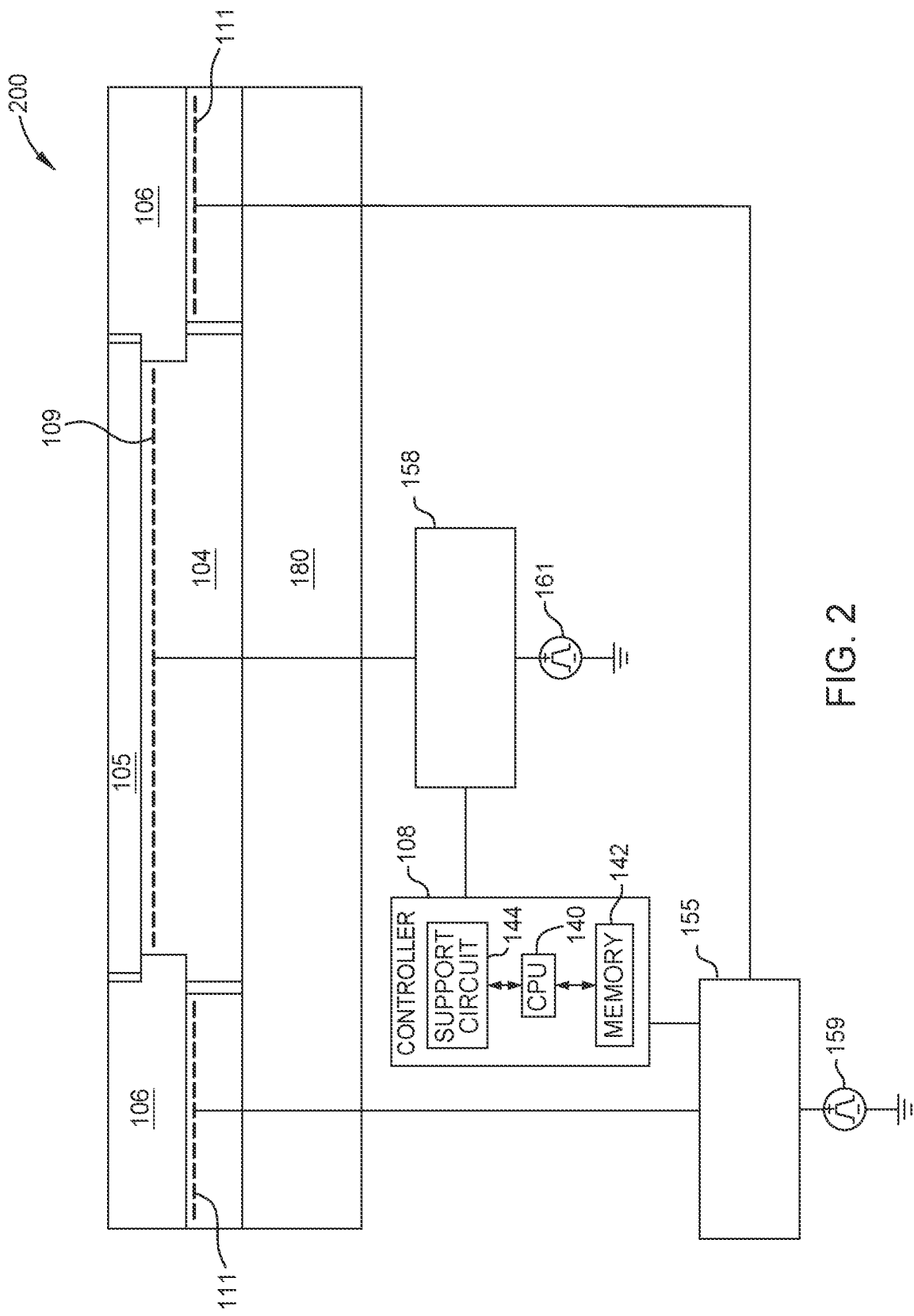
FIG. 2 is a schematic overview of an example processing chamber according to at least one embodiment of the present disclosure.

FIG. 2 is a schematic overview of a processing chamber 200 according to at least one embodiment of the present disclosure. The processing chamber 200 is configured to practice the schemes described herein. As with processing chamber 100, processing chamber 200 is a plasma processing chamber, such as those described above.

The processing chamber 200 includes a substrate 105 disposed on a substrate support assembly 104 as described in FIG. 1. An edge ring 106 is positioned on the substrate support assembly 104 and surrounds the periphery of the substrate 105. Although not shown, a capacitively coupled plasma apparatus is disposed above the substrate (typically above a chamber lid). The capacitively coupled plasma apparatus can include an ion suppressor and a showerhead where RF power is delivered from an electrode underneath the substrate to generate capacitively coupled plasma. A controller 108 is adapted to control systems and subsystems of the processing chamber. The controller 108 comprises a central processing unit (CPU) 140, a memory 142, and support circuits 144 for the CPU 140 and facilitates control of the components of the processing chamber 100. The controller 108 can be one of any form of general-purpose computer processor that can be used in an industrial setting for controlling various chambers and sub-processors. The memory 142 stores software (source or object code) that can be executed or invoked to control the operation of the processing chamber 100 in the manner described herein. The controller 108 is configured to control the first shaped DC voltage source 159, the second shaped DC voltage source 161, the edge ring IEDF width control circuit 155, and/or the substrate IEDF width control circuit 158. FIGS. 4A-4D, discussed below, show different configurations of connecting the IEDF width control module to the pulsers.

The substrate support assembly 104, facility plate 180, substrate electrode 109, and edge ring electrode 111 can be the same as that discussed in FIG. 1. An edge ring IEDF width control circuit 155 is coupled to the edge ring electrode 111. A substrate IEDF width control circuit 158 is coupled to the substrate electrode 109. In one embodiment, a first shaped DC pulse voltage source 159 is coupled to one or both of the edge ring IEDF width control circuit 155 and the substrate IEDF width control circuit 158. In another embodiment, the first shaped DC voltage source 159 is coupled to the edge ring IEDF width control circuit 155 and a second shaped DC voltage source 161 is coupled to the substrate IEDF width control circuit 158. The edge ring IEDF width control circuit 155 and the substrate IEDF width control circuit 158 are independently tunable. The substrate electrode 109 is further coupled to a chucking power source 115 to facilitate chucking of the substrate 105 to the upper surface 160 with the electrostatic chuck 150 during processing.

Operation of the processing chamber 200 and processing of the substrate 105 can be performed in a similar fashion as that of processing chamber 100. In some embodiments, the processing system configurations include an ion suppressor positioned inside a processing chamber to control the type and quantity of plasma excited species that reach the substrate. In some embodiments, the ion suppressor unit is a perforated plate that may also act as an electrode of the plasma generating unit. In these and other embodiments, the ion suppressor can be the showerhead that distributes gases and excited species to a reaction region in contact with the substrate. In some embodiments, ion suppression is realized by a perforated plate ion suppressor and a showerhead, both of which plasma excited species pass through to reach the reaction region.

Figure 3B:
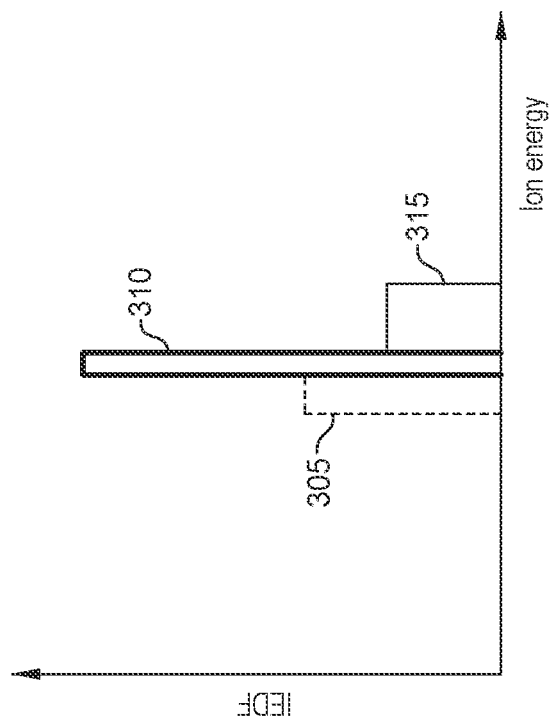
FIG. 3B is an exemplary plot of IEDF versus ion energy for the three different bias voltage waveforms on a substrate shown in FIG. 3A according to at least one embodiment of the present disclosure.
Figure 3A:
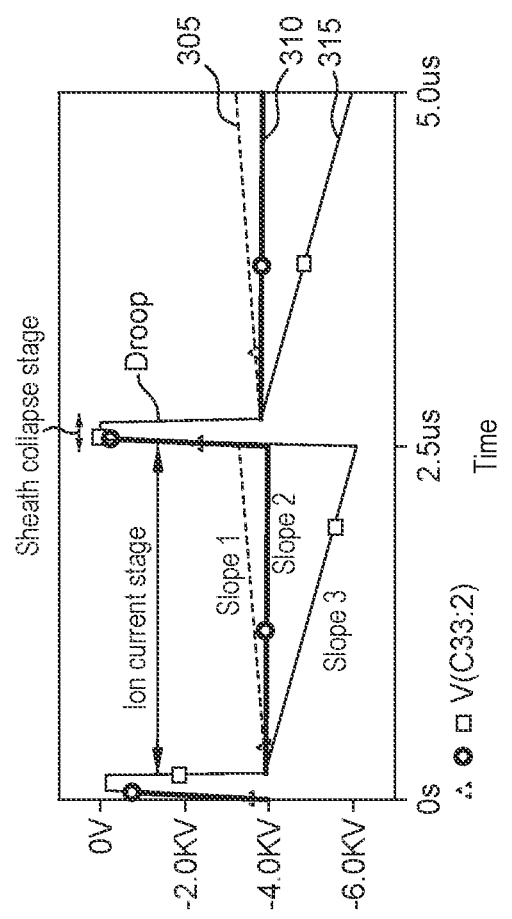
FIG. 3A is an exemplary graph showing three different bias voltage waveforms on a substrate according to at least one embodiment of the present disclosure.

When voltage is applied to the substrate (or wafer) by the shaped DC voltage source 159, a waveform develops. FIG. 3A shows different bias voltage waveforms. The waveform includes two stages: an ion current stage and a sheath collapse stage. At the beginning of the ion current stage, a drop of wafer voltage creates a high voltage sheath above the substrate which accelerates positive ions to the substrate. The positive ions deposit positive charge on the substrate surface and tend to gradually increase the substrate voltage positively. If a square wave is supplied by the shaped DC voltage source 159, the ion current towards the substrate creates a positive slope of the substrate voltage, as shown by trace 305. The voltage difference between the beginning and end of the ion current phase determines the IEDF width. The larger the voltage difference, the wider the IEDF width (FIG. 3B). To achieve monoenergetic ions and a narrower IEDF width, operations are performed to flatten the substrate voltage waveform (e.g., trace 310) in the ion current phase. In some embodiments, a voltage can be applied in order to achieve a certain IEDF width, as shown by the substrate waveform of trace 315.

At the end of the ion current stage, the substrate voltage rises to the bulk plasma voltage and the sheath collapses, such that electrons travel from the plasma to the substrate surface and neutralizes the positive charges at the substrate surface. As a result, the surface of the substrate is reset for the next cycle.

In some embodiments, the first and second shaped DC voltage sources 159 and 161 are positive pulsers. Positive pulsers generate pulses of positive voltage which corresponds to the sheath collapse stage. When each positive pulse turns off, the ion current stage begins. In some embodiments, the first and second shaped DC voltage sources 159 and 161 are negative pulsers. Negative pulsers generate pulses of negative voltage which corresponds to the ion current stage. When each negative pulse turns off, the sheath collapse stage begins.

Example Circuits

Figure 4B:
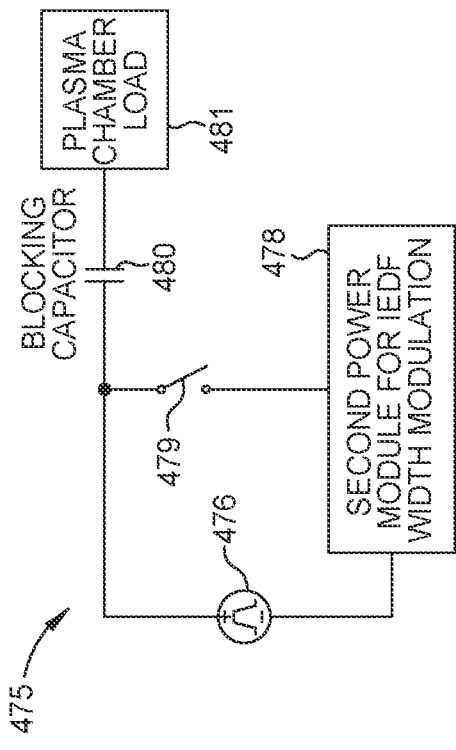
FIG. 4B is a schematic overview of an example circuit according to at least one embodiment of the present disclosure.
Figure 4D:
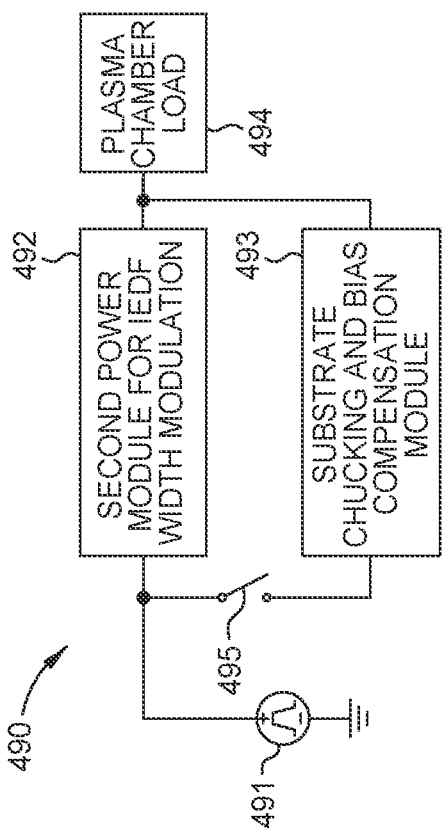
FIG. 4D is a schematic overview of an example circuit according to at least one embodiment of the present disclosure.
Figure 4A:
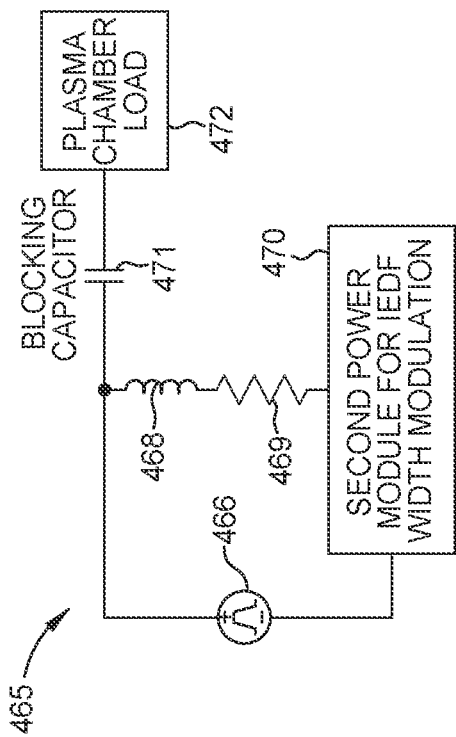
FIG. 4A is a schematic overview of an example circuit according to at least one embodiment of the present disclosure.
Figure 5A:
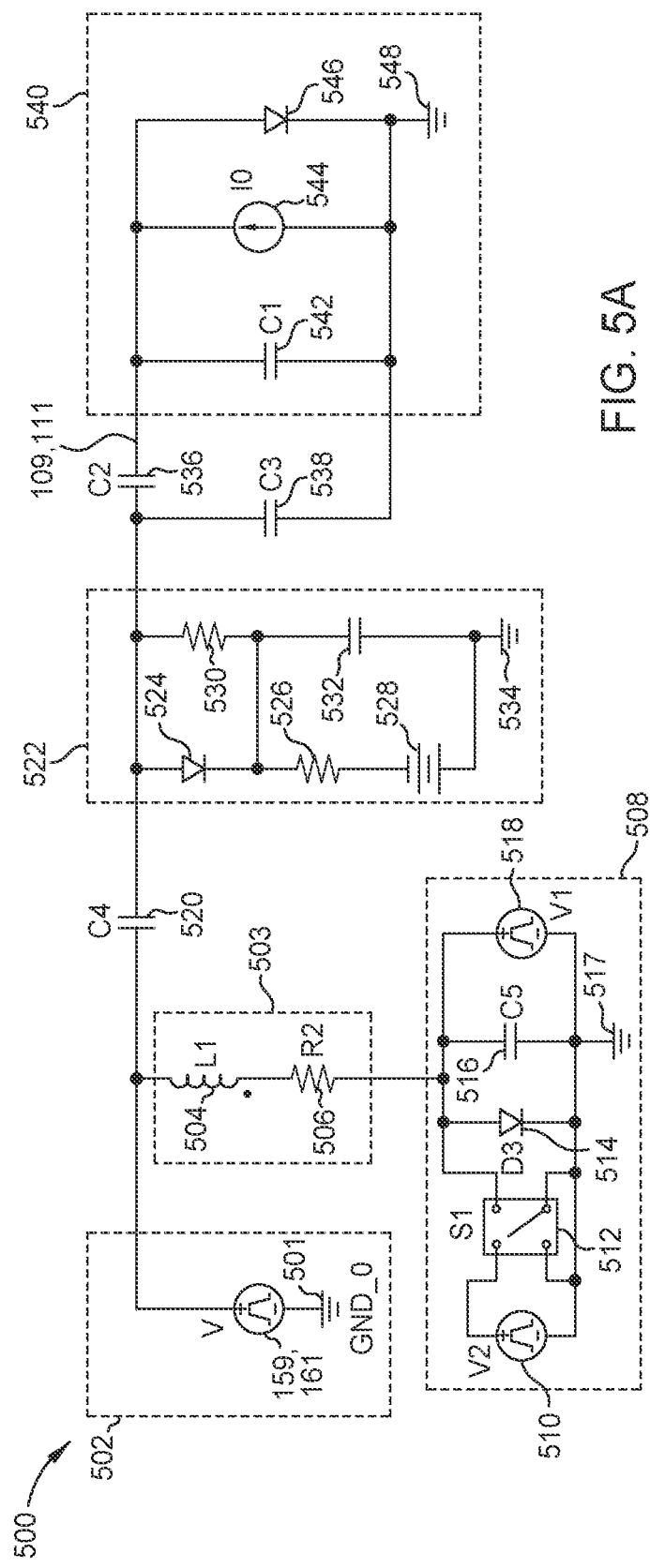
FIG. 5A is an example schematic circuit diagram illustrating the IEDF width control circuit for driving the electrodes of the substrate support assembly according to at least one embodiment of the present disclosure.
Figure 6A:
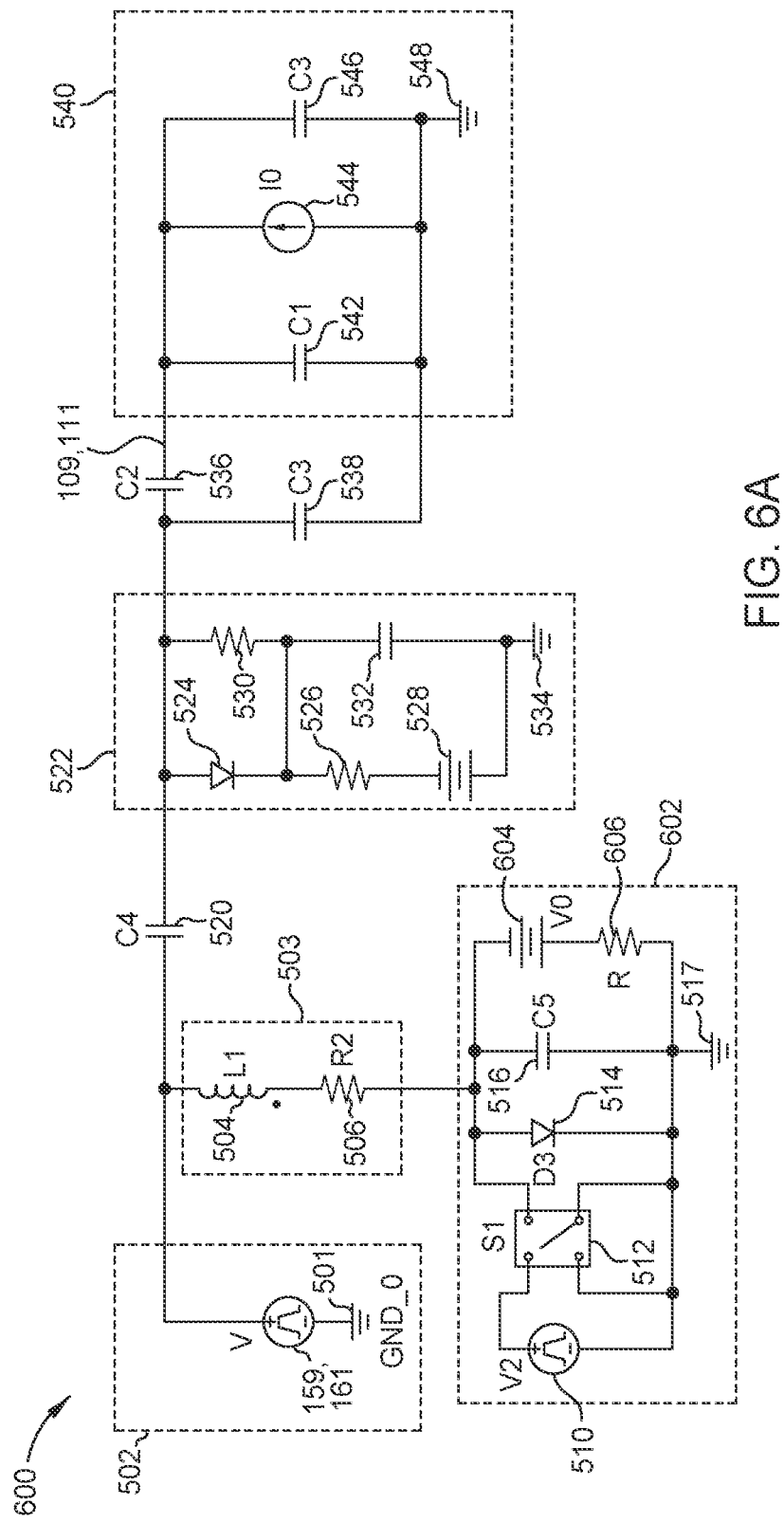
FIG. 6A is an example schematic circuit diagram illustrating the IEDF width control circuit for driving the electrodes of the substrate support assembly according to at least one embodiment of the present disclosure.

FIG. 4A is a schematic overview of an example circuit 465. As described below, and in some embodiments, the example circuit illustrated in FIG. 4A corresponds to the circuit diagram of FIGS. 5A and 6A. FIGS. 5A and 6A differ by, e.g., the circuitry of the second power module.

The example circuit 465 includes a pulsed DC power supply 466 coupled to a second power module 470 through a series inductor 468 and a resistor 469 in series. The second power module 470 modulates the width of the ion energy distribution function (IEDF). An optional blocking capacitor 471 may exist between plasma chamber load 472 and the rest of the circuit 465. A controller, not shown, which may be realized by hardware, software, firmware, or a combination thereof, is utilized to control various components represented in FIG. 4A.

The shaped DC power supply 466 generates a voltage waveform with two voltage levels—a low voltage level and a high voltage level. The low voltage level corresponds to the ion current stage. The high voltage level corresponds to the sheath collapse stage. In the ion current stage, the second power module 470 modulates the slope of the voltage vs. time, shown in FIG. 3A as traces 305, 310, and 315. Different slopes result in different IEDF widths as shown in FIG. 3B. The flattest slope (trace 305, FIG. 3A) corresponds to the narrowest IEDF width in FIG. 3B.

FIG. 4B is a schematic overview of an example circuit 475. As shown, FIG. 4B differs from FIG. 4A by replacing the series inductor 468 and resistor 469 with a switch 479. The switch 479 is connected in series with a pulsed DC power supply 476 and a second power module 478. During the ion current stage, the switch 479 is closed. During the sheath collapse stage, the switch can be either open or closed. A controller, not shown, which may be realized by hardware, software, firmware, or a combination thereof, is utilized to control various components represented in FIG. 4B.

Figure 4C:
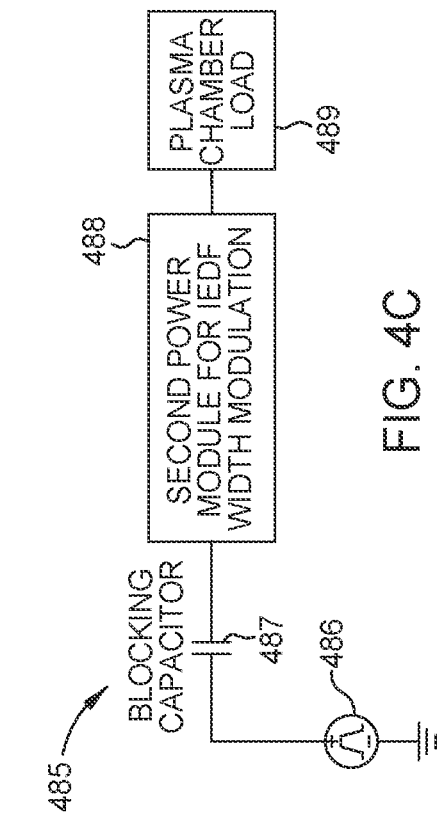
FIG. 4C is a schematic overview of an example circuit according to at least one embodiment of the present disclosure.

FIG. 4C is a schematic overview of an example circuit 485. As described below, and in some embodiments, the example circuit 485 illustrated in FIG. 4C corresponds to the circuit diagrams of FIGS. 7A and 8. The example circuit 485 includes a shaped DC voltage source 486 coupled to ground. An optional blocking capacitor 487 may exist between the shaped DC voltage source 486 and a second power module 488. The second power module 488 modulates the width of the IEDF. The second power module 488 is further coupled to a plasma chamber load 489. A controller, not shown, which may be realized by hardware, software, firmware, or a combination thereof, is utilized to control various components represented in FIG. 4C.

The shaped DC voltage source 486 generates a voltage waveform with two voltage levels—a low voltage level and a high voltage level. The low voltage level corresponds to the ion current stage. The high voltage level corresponds to the sheath collapse stage. In the ion current stage, the second power module 488 creates a voltage slope vs. time. The resulting voltage waveform on the substrate is the sum of the output voltage of the shaped DC voltage source 486 and the second power module 488, which can be modulated, and thereby, the IEDF width is modulated.

FIG. 4D is a schematic overview of an example circuit 490 according to at least one embodiment of the present disclosure. As described below, and in some embodiments, example circuit 490 corresponds to the circuit diagrams of FIGS. 9 and 10. The example circuit 490 includes a shaped DC voltage source 491 coupled to ground, second power module 492, and substrate chucking and bias compensation module 493. A switch 495 is connected in series with the substrate chucking and bias compensation module 493. The second power module 492 and the substrate chucking and bias compensation module 493 are connected in parallel, with one end coupled to the shaped DC voltage source 491 and the other end coupled to a plasma chamber load 494. The second power module 492 modulates the width of the IEDF. The second power module 492 and the substrate chucking and bias compensation module 493 are further coupled to a plasma chamber load 494. A controller, not shown, which may be realized by hardware, software, firmware, or a combination thereof, is utilized to control various components represented in FIG. 4D.

The shaped DC voltage source 491 generates a voltage waveform with two voltage levels—a low voltage level and a high voltage level. The low voltage level corresponds to the ion current stage. The high voltage level corresponds to the sheath collapse stage. In the ion current stage, the second power module 492 creates a voltage slope vs. time. The resulting voltage waveform on the substrate is the sum of the output voltage of the shaped DC voltage source 491 and the second power module 492, which can be modulated, and thereby, the IEDF width is modulated. The switch 495 is open in the ion current stage, such that the chucking and bias compensation module 493 do not modulate the voltage of the plasma chamber load. In the sheath collapse stage, the switch 495 is closed, and the chucking and bias compensation module 493 resets the substrate chucking voltage to a setpoint.

FIG. 5A is a schematic circuit diagram illustrating an embodiment of an edge ring voltage control circuit/substrate voltage control circuit 500 for driving the substrate electrode 109 and/or the edge ring electrode 111 of substrate support assembly 104. Circuit 500 includes a main pulser 502 to reset the substrate voltage (corresponding to the voltage droop in FIG. 3A) at the beginning of each ion current phase. The main pulser 502 can be the first or second shaped DC voltage source 159, 161 coupled to ground 501. The main pulser 502 is coupled to a current return path 503. The current return path 503 includes an inductor 504 coupled in series with a resistor 506 to an IEDF width control module 508 (e.g., second power module in FIGS. 4A and 4B). The IEDF width control module 508 modulates the ion energy distribution function (IEDF) width.

The IEDF width control module 508 can be modeled as a circuit comprising a transistor-transistor logic (TTL) signal 510 coupled in parallel with a switch 512, an optional diode 514, an optional capacitance 516 coupled to ground 517, and a third shaped DC pulse voltage source 518. Diode 514 is a flyback diode for protecting the switch 512 and the third shaped DC pulse voltage source 518. In some embodiments, a capacitance 520 exists between the current return path 503 and a chamber capacitance 536. The capacitance 536 can be, for example, the impedance between the substrate electrode 109 and the substrate, or between the edge ring electrode 111 and the edge ring. In some embodiments, the capacitance is also coupled to a substrate chucking and bias compensation module 522.

The substrate chucking and bias compensation module 522 is a circuit that includes a diode 524 coupled in series to a resistor 526, and a DC voltage source 528, and a resistor 530 coupled in series to a capacitance 532 and ground 534. The capacitance 536 is further coupled to stray capacitance 538 and the plasma sheath 540. The substrate chucking and bias compensation module 522 is further coupled to stray capacitance 538. The plasma sheath 540 may be modeled (plasma sheath model) as a circuit comprising a sheath capacitance 542 coupled in parallel with a current source 544 and a diode 546 coupled to ground 548. In some embodiments, the series inductor 504 and resistor 506 in the current return path can be replaced by a switch 179 (FIG. 4B). The switch 179 is closed during the ion current stage.

In use, and for the configuration illustrated in FIG. 5A, the third shaped DC pulse voltage source 518 acts as an active knob for controlling the slope of the voltage waveform in the ion current stage. The switch 512 is controlled by TTL signal 510 synchronized with the main pulser 502, as shown in plot 550 of FIG. 5B. The switch 512 can be closed before the voltage of the main pulser 502 goes up to enter the sheath collapse stage. The switch 512 can be kept closed during the sheath collapse stage to connect the current return path 503 to ground. After the voltage of the main pulser 502 goes down to enter the ion current stage, the switch 512 can be opened such that the third shaped DC pulse voltage source 518 is functioning to modulate the IEDF during the ion current stage. The optional capacitance 516 can be used to adjust the sensitivity of the substrate voltage waveform to the third shaped DC pulse voltage source 518. Capacitance 542 is a plasma sheath capacitance, which is different in different process conditions, and current source 544 is the ion current towards the substrate that is also a variable. Capacitance 536 and stray capacitance 538 are capacitances related to the chamber and are constant. Capacitance 520 is a blocking capacitor and is also constant.

Figure 5B:
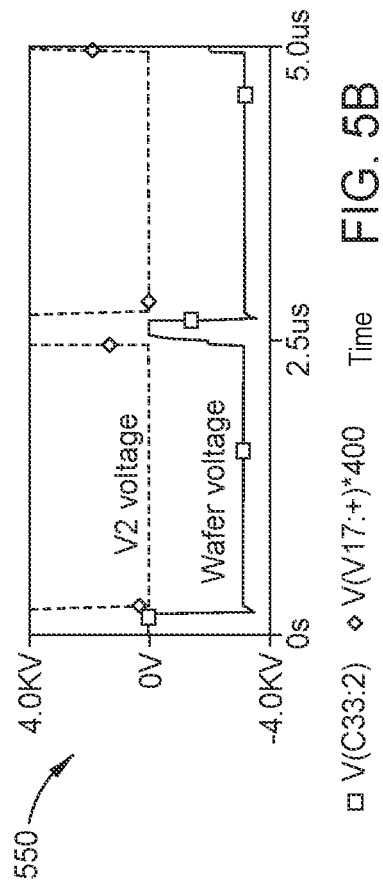
FIG. 5B is an exemplary plot of V2 voltage waveform and substrate voltage waveform for the example schematic circuit diagram shown in FIG. 5A according to at least one embodiment of the present disclosure.
Figure 5D:
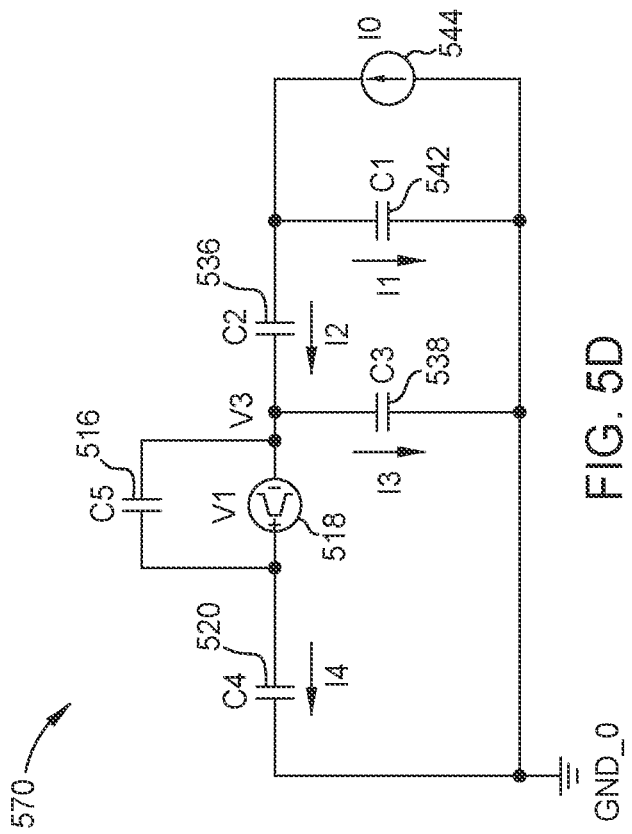
FIG. 5D is an example control circuit according to at least one embodiment of the present disclosure.
Figure 5C:
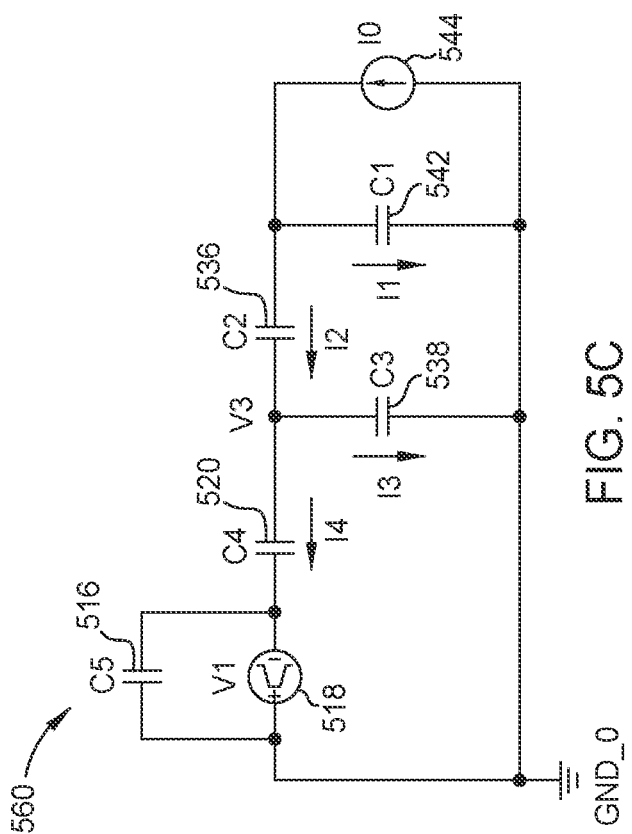
FIG. 5C is an example control circuit according to at least one embodiment of the present disclosure.

As shown in FIG. 5C and FIG. 5D, during the ion current stage and when the IEDF width control module 508 (FIG. 5A) is controlling the substrate or edge ring waveform actively, the active components in the circuit model include the ion current 544 (I0), the sheath capacitance 542 (C1), the chamber capacitance 536 (C2), the stray capacitance 538 (C3), the blocking capacitance 520 (C4), and the optional capacitance 516 (C5) in parallel with the third shaped DC pulse voltage source 518 (V1). Because the inductor 504 and the resistor 506 in the current return path have little impact on IEDF width modulation, the inductor 504 and the resistor 506 are treated as short in the control circuit 560 of FIG. 5C and the control circuit 570 of FIG. 5D.

The intrinsic factor to broaden the IEDF is the ion current, I0, depositing positive charges on the substrate such that the voltage of the substrate gradually increases and the ion energy bombarding the substrate drops (e.g., trace 305 of FIG. 3A). The amount of IEDF broadening depends on, e.g., the ion current I0, the sheath capacitance C1, and/or other capacitances associated with the chamber C2, C3 and C4, and power supply module, V1 and C5, in the control circuits 560, 570. In order to compensate the ion current effect of IEDF broadening and/or have active control of IEDF width, the values of all the components in this control circuit (FIG. 5C) are determined. The capacitances associated with the chamber and power supply module, C2 through C5, can be determined by the product specification sheet or estimation using chamber parts dimensions, or by prior measurement, such as direct measurement of the impedance using a multimeter, or extracting the capacitance value from S-parameter or Z-parameter measurements. The ion current I0 and the sheath capacitance C1 vary at varying plasma process conditions and are determined via real-time measurement during the plasma process. The shaped DC pulse voltage source V1 has a saw-shaped voltage output (FIG. 5E). The slope of the voltage output, $dV1/dt$, can be varied to determine the ion current I0 and the sheath capacitance C1, and/or to modulate the IEDF width. In the configuration of FIG. 5A, the output voltage of the shaped DC pulse voltage source V1 in the sheath collapse stage is zero, as trace 584 shows. Traces 582 and 586 show other possible waveforms for the shaped DC pulse voltage source V1, as discussed below.

The method of IEDF modulation includes two parts: (1) determining the ion current I0 and the sheath capacitance C1, and (2) determining the slope of the shaped DC pulse voltage source $dV1/dt$ to achieve a target IEDF width. With a saw-like voltage source V1 and shaped DC voltage source 159 or 161 supplying power to the substrate 105 or edge ring 106, the IEDF width at the substrate or edge ring is the change of substrate or edge ring voltage from the beginning to the end of the ion current stage (FIG. 3A and FIG. 3B). In the control circuit 560 FIG. 5C and the control circuit 570 FIG. 5D, the IEDF width corresponds to the change of voltage across the sheath capacitance C1 from the beginning to the end of the ion current stage, which is determined by the charging or discharging current, I1, through the sheath capacitance C1:

$$\Delta V = I1 * T / C1, \quad (1)$$

where $\Delta V$ is the IEDF width and T is the time duration of the ion current stage. In order to obtain the target IEDF width ($\Delta V$), the sheath capacitance C1 and the desired current I1 through the sheath capacitance are to be determined.

To determine the sheath capacitance C1 and the ion current I0, the relationships of the currents and voltages in the control circuit are analyzed. As shown, the currents passing the capacitors C1 through C4 are referred to as I1 through I4, with the arrows in the circuit schematic pointing to the positive direction. Based on Kirchhoff's current law, the ion current I0 equals the sum of the currents through capacitors C1 and C2:

$$I0 = I1 + I2. \quad (2)$$

The current through capacitor C2 equals the sum of the currents through capacitors C3 and C4:

$$I2 = I3 + I4. \quad (3)$$

Based on Kirchhoff's voltage law, the voltage sum of the closed loop of C1, C2, and C3 is zero. The time derivative of the voltage sum of C1, C2, and C3 is also zero. Denote the voltage at the intersection of capacitors C2 and C3 as V3. The time derivative of the voltage across capacitor C3 is $dV3/dt = I3/C3$. Similar relationships exist for capacitors C1 and C2, and Kirchhoff's voltage law provides equation (4):

$$I1/C1 = I2/C2 + I3/C3. \quad (4)$$

Applying Kirchhoff's voltage law to the closed loop of capacitors C3 and C4 and voltage source V1 provides equation (5):

$$I3/C3 = I4/C4 + dV1/dt. \quad (5)$$

In equations (2)-(5), C2, C3, and C4 are prior determined by the product specification sheet or estimation based on chamber parts dimensions, or by prior measurement, such as direct measurement of the impedance using a multimeter, or extracting the capacitance value from S-parameter or Z-parameter measurements. The current I4 can be measured directly by sensors, such as current probes and/or integrated voltage-current (VI) sensors. Voltage V3 can be measured directly by sensors, such as voltage probes and/or integrated VI sensors. Current I3 can be calculated as $I3 = C3 * dV3/dt$. The voltage slope $dV1/dt$ is user-controlled and known, such as zero or 1 Volt/nanosecond (V/nsec). By setting the shaped DC pulse voltage source V1 at two different slopes dV1/dt and dV1'/dt, the currents I4, I4' and the time derivatives of the voltage dV3/dt, dV3'/dt can be determined. The set of equations (2)-(5) at two slopes dV1/dt and dV1'/dt form eight equations that can be solved to give the sheath capacitance:

$$C1 = \frac{\left(1 + \frac{C3}{C4}\right)(I4 - I4') + C3\left(\frac{dV1}{dt} - \frac{dV1'}{dt}\right)}{\left(\frac{1}{C2} + \frac{1}{C4} + \frac{C3}{C2C4}\right)(I4 - I4') + \left(\frac{C3}{C2} + 1\right)\left(\frac{dV1}{dt} - \frac{dV1'}{dt}\right)}; \quad (6)$$

and the ion current:

$$I0 = \left(1 + \frac{C1}{C2} + \frac{C1}{C4} + \frac{C3}{C4} + \frac{C1C3}{C2C4}\right)I4 + \frac{C1C3}{C2} + C1 + C3\right)\frac{dV1}{dt}. \quad (7)$$

To obtain the target IEDF width (ΔV), the total current through the sheath capacitor C1 is $$I1 = C1 * \Delta V/T. \quad (8)$$

Plugging equations (6)-(8) into equations (2)-(5) gives the voltage slope of the saw-like voltage source V1 for achieving the IEDF width ΔV:

$$\frac{dV1}{dt} = -\left(\frac{1}{C2} + \frac{1}{C4} + \frac{C3}{C2C3}\right)I_0 + \quad (9)$$

$$\left(\frac{1}{C1} + \frac{1}{C2} + \frac{1}{C4} + \frac{C3}{C1C4} + \frac{C3}{C2C4}\right)C1^*\Delta V/T.$$

In the case of the narrowest IEDF (ΔV=0), the voltage slope of the saw-like voltage source V1 is $$\frac{dV1}{dt} = -\left(\frac{1}{C2} + \frac{1}{C4} + \frac{C3}{C2C4}\right)I_0. \quad (10)$$

FIG. 6A is a schematic circuit diagram illustrating an embodiment of an edge ring voltage control circuit/substrate voltage control circuit 600 for driving the substrate electrode 109 and/or the edge ring electrode 111 of substrate support assembly 104. Circuit 600 includes a main pulser 502 to reset the substrate voltage (corresponding to the voltage droop in FIG. 3A) at the beginning of each ion current phase. The main pulser 502 can be a first or second shaped DC voltage source 159, 161 coupled to ground 501. The main pulser 502 is coupled to a current return path 503. The current return path 503 includes an inductor 504 coupled in series with a resistor 506 to an IEDF width control module 602 (e.g., second power module in FIGS. 4A and 4B). The IEDF width control module 602 modulates IEDF width. The IEDF width control module 602, which differs from the configuration of FIG. 5A, may be modeled as a circuit comprising a TTL signal 510 coupled in parallel with a switch 512, a diode 514, an optional capacitance 516 coupled to ground 517, and a DC voltage source 604 coupled in series to resistor 606. Diode 514 is a flyback diode for protecting the switch 512 and the DC voltage source 604. In some embodiments, a blocking capacitance 520 exists between the current return path 503 and a chamber capacitance 536. The capacitance 536 can be, for example, the impedance between the substrate electrode 109 and the substrate, or between the edge ring electrode 111 and the edge ring. In some embodiments, a substrate chucking and bias compensation module 522 is also coupled to the blocking capacitance 520 and the chamber capacitance 536. The substrate chucking and bias compensation module 522 is further coupled to stray capacitance 538. The substrate chucking and bias compensation module 522 is a circuit that includes a diode 524 coupled in series to a resistor 526, and a DC voltage source 528, and a resistor 530 coupled in series to a capacitance 532 and ground 534.

The plasma sheath 540 may be modeled (plasma sheath model) as a circuit comprising a sheath capacitance 542 coupled in parallel with a current source 544 and a diode 546 coupled to ground 548.

In use, and for the configuration illustrated in FIG. 6A, the DC voltage source 604 together with the resistor 606 acts as an active knob for controlling the slope of the substrate or edge ring voltage waveform in the ion current stage, as opposed to the configuration of FIG. 5A, where the third shaped DC pulse voltage source 518 acts as an active knob for controlling the slope of the voltage waveform in the ion current stage. The switch 512 can be controlled by TTL signal 510 synchronized with the main pulser 502, as shown in FIG. 5B. The switch 512 can be closed before the voltage of the main pulser 502 goes up to enter the sheath collapse stage. The switch 512 can be kept closed during the sheath collapse stage to connect the current return path 503 to ground. After the voltage of the main pulser 502 goes down to enter the ion current stage, the switch 512 can be opened, such that the DC voltage source 604 is functioning to modulate IEDF in the ion current stage. The optional capacitance 516 can be used to adjust the sensitivity of the substrate voltage waveform to the DC voltage source 604. Capacitance 542 is a plasma sheath capacitance and is variable. Current source 544 is an ion current towards the substrate and also varies. Capacitance 536 can be, for example, the capacitance between the substrate electrode 109 and the substrate, or between the edge ring electrode 111 and the edge ring. Capacitance 538 can be the capacitance the substrate electrode 109 and ground, or between the edge ring electrode 111 and ground. Capacitance 520 is a blocking capacitor and is also constant.

As shown in FIG. 6B and FIG. 6C, during the ion current stage and when the IEDF width control module 602 (FIG. 6A) is controlling the substrate or edge ring waveform actively, the active components in the circuit model include the ion current 544 (I0), the sheath capacitance 542 (C1), the chamber capacitance 536 (C2), the stray capacitance 538 (C3), the blocking capacitance 520 (C4), and the optional capacitance 516 (C5) in parallel with the DC voltage source 604 (V0) and resistor 606 (R). Because the inductor 504 and the resistor 506 in the current return path have little impact on IEDF width modulation, the inductor 504 and the resistor 506 are treated as short in the control circuit 650 of FIG. 6B and the control circuit 660 of FIG. 6C. The control circuit of FIG. 6A is shown in FIG. 6B, while the control circuit of FIG. 7A, described below, is shown in FIG. 6C.

The intrinsic factor to broaden IEDF is the ion current I0 depositing positive charges on the substrate such that the voltage of the substrate gradually increases and the ion energy bombarding the substrate drops (trace 305 of FIG. 3A). The amount of IEDF broadening depends on, e.g., the ion current I0, the sheath capacitance C1, and other capacitances associated with chamber (C2, C3, and C4), and the power supply module (V0, R, and C5) in control circuit 650 and control circuit 660 of FIG. 6B and FIG. 6C, respectively. In order to compensate the ion current effect of IEDF broadening and have active control of IEDF width, the values of all the components in control circuit 650 and control circuit 660 are determined. The capacitances associated with the chamber and power supply module, C2 through C5, can be determined by the product specification sheet or estimation using chamber parts dimensions, or by prior measurement, such as direct measurement of the impedance using a multimeter, or extracting the capacitance value from S-parameter or Z-parameter measurements. The resistor R is also prior determined by the product specification sheet or by direct measurement utilizing a multimeter. The ion current I0 and the sheath capacitance C1 vary at varying plasma process conditions are determined by real-time measurement during the plasma process. The DC voltage source V0 is the active control knob and can be varied to determine the ion current I0, to determine the sheath capacitance C1, and/or to modulate the IEDF width.

The method of IEDF modulation includes two parts: (1) determining the ion current I0 and the sheath capacitance C1, and (2) determining the DC voltage V0 to achieve the target IEDF width. The IEDF width is the spread of the substrate or edge ring voltage from the beginning to the end of the ion current stage (FIG. 3A and FIG. 3B). In the control circuit 650 of FIG. 6B and the control circuit 660 of FIG. 6C, the IEDF width corresponds to the change of the voltage across the sheath capacitance C1 from the beginning to the end of the ion current stage, which is determined by the charging or discharging current, I1, through the sheath capacitance C1:

$$\Delta V = \frac{1}{C1} \int_0^T I_1 d\tau, \qquad (11)$$

where ΔV is the IEDF width and T is the time duration of the ion current stage. In order to obtain the target IEDF width (ΔV), the sheath capacitance C1 and the desired current I1 through the sheath capacitance are to be determined.

To determine the sheath capacitance C1 and the ion current I0, the relationships of the currents and voltages in the control circuit are analyzed. Here, for example, the currents passing the capacitors C1 through C5 are referred to as I1 through I5, with the arrows in the circuit schematic pointing to the positive direction. The voltage at the intersection of capacitors C2 and C3 is V3. There is a threshold voltage for the DC voltage source V0, denoted as Vth, below which the diode D3 bypasses the series of the DC voltage source V0 and the resistor R such that the output voltage of the IEDF width control module is zero. Vth is plasma-condition dependent and can be determined experimentally by, e.g., gradually increasing the DC voltage V0 up to the point that the current I4 or voltage V3 is affected by the DC voltage output V0.

In the case of V0≤Vth, based on Kirchhoff's current law, the ion current I0 equals the sum of the currents through capacitors C1 and C2:

$$I0 = I1 + I2. \qquad (12)$$

The current through capacitor C2 equals the sum of the currents through capacitors C3 and C4:

$$I2 = I3 + I4. \qquad (13)$$

Based on Kirchhoff's voltage law, the voltage sum of the closed loop of C1, C2, and C3 is zero. The time derivative of the voltage sum of C1, C2, and C3 is also zero. The time derivative of the voltage across capacitor C3 is dV3/dt=I3/C3. The same relationships hold for capacitors C1 and C2. Using Kirchhoff's voltage law on capacitors C1 and C2 provides equation (14):

$$I1/C1 = I2/C2 + I3/C3. \qquad (14)$$

Applying Kirchhoff's voltage law to the closed loop of capacitors C3 and C4, as well as the diode-bypassed IEDF width control module, provides equation (15):

$$I3/C3 = I4/C4. \qquad (15)$$

In the case of V0>Vth, equations (12)-(14) still hold. Applying Kirchhoff's voltage law to the closed loop of capacitors C3, C4, and C5 provides equation (16):

$$I3/C3 = I4/C4 + I5/C5. \qquad (16)$$

Applying Kirchhoff's voltage law to the closed loop of capacitor C5, DC voltage source V0, and resistor R provides equation (17):

$$\frac{I5}{C5} = R \frac{d(I4 - I5)}{dt}, \qquad (17)$$

where (I4-I5) is the current through the DC voltage source V0 and the resistor R when the diode D3 is inactive.

In some embodiments, there is no capacitor C5. In such cases, there is no equation (17) and equation (16) becomes $$I3/C3 = I4/C4 + R*dI4/dt, \qquad (18)$$

In equations (12)-(18), C2, C3, C4, and C5 are prior determined by the product specification sheet or estimation based on chamber parts dimensions, or by prior measurement, such as direct measurement of the impedance using a multimeter, or extracting the capacitance value from S-parameter or Z-parameter measurements. The current I4 can be measured directly by sensors, such as current probes and/or integrated VI sensors. Voltage V3 can be measured directly by sensors, such as voltage probes and/or integrated VI sensors. Current I3 can be calculated as I3=C3*dV3/dt. The DC voltage V0 is user-controlled and known, such as setting the DC voltage output V0 to a value from zero to a few kV. By setting the DC voltage V0 at two different values V0 and V0', with at least one of them above the threshold voltage Vth, the currents I4, I4' and the time derivatives of the voltage dV3/dt, dV3'/dt can be determined. Solving the set of equations (12)-(18) gives the sheath capacitance C1:

$$C1 = \frac{I3 - I3' + I4 - I4'}{\frac{I3 - I3' + I4 - I4'}{C2} + \frac{I3 - I3'}{C3}}; \qquad (19)$$

and the ion current I0:

$$I0 = (C1/C2 + C1/C3 + 1)*I3 + (C1/C2 + 1)*I4. \qquad (20)$$

Plugging in the sheath capacitance C1 and the ion current I0 in the set of equations (12)-(18), the currents I1 through I5 can be calculated for any DC voltage V0.

Plugging in the expression of I1 into equation (11) by the known capacitances C1 through C5, the resistance R, and the DC voltage V0, the relationship between the IEDF width (ΔV) and the DC voltage V0 can be obtained. Accordingly, for a target IEDF width (ΔV), the required DC voltage V0 is determined.

In some embodiments, the resistor R is large enough (e.g., about 10 kΩ), and the current through the DC voltage source V0 is approximately time constant in the ion current stage and equal to V0/R. In these embodiments, equation (17) becomes $$I4 = I5 + V0/R. \quad (21)$$

Solving equations (12), (13), (14), (16), and (21) gives the total current through the sheath capacitor C1 as equation (22):

$$I1 = \left[I0\left(\frac{1}{C2} + \frac{C4+C5}{k}\right) + \frac{C3(C4+C5)V0}{kRC3}\right]\left(\frac{1}{C1} + \frac{1}{C2} + \frac{C4+C5}{k}\right), \quad (22)$$

where $$k = C3C4 + C4C5 + C5C3$$

Using equation (8) for this approximate case of constant current I1, the DC voltage V0 utilized for obtaining the target IEDF width (ΔV) can be found using equation (23):

$$V0 = \left[\frac{C1\Delta V}{T}\left(\frac{1}{C1} + \frac{1}{C2} + \frac{C4+C5}{k}\right) - I0\left(\frac{1}{C2} + \frac{C4+C5}{k}\right)\right] / \frac{C3(C4+C5)}{kRC5}. \quad (23)$$

In the case of narrowest IEDF (ΔV=0), the DC voltage V0 is $$V0 = -I0\left(\frac{1}{C2} + \frac{C4+C5}{k}\right) / \frac{C3(C4+C5)}{kRC5}. \quad (24)$$

FIG. 7A is a schematic circuit diagram illustrating an embodiment of an edge ring voltage control circuit/substrate voltage control circuit 700 for driving the substrate electrode 109 and/or the edge ring electrode 111 of substrate support assembly 104. Circuit 700 includes a main pulser 502 to reset the substrate voltage (corresponding to the voltage droop in FIG. 3A) at the beginning of each ion current phase. The main pulser 502 can be the first or second shaped DC voltage source 159, 161 coupled to ground 501. The main pulser 502 is coupled to an IEDF width control module 702 (e.g., second power module in FIG. 4C) either directly or through a capacitance 701.

The IEDF width control module 702 may be modeled as a circuit comprising a TTL signal 704 coupled in parallel with a switch 706. The TTL signal 704 is coupled in series with ground 716. Switch 706 is coupled in parallel to diode 708, a DC voltage source 710, and an optional capacitance 714. The DC voltage source 710 is coupled in series to resistor 712. The IEDF width control module 702 is coupled to a chamber capacitance 536. The capacitance 536 can be, for example, the impedance between the substrate electrode 109 and the substrate, or between the edge ring electrode 111 and the edge ring. In some embodiments, the IEDF width control module 702 is also coupled to the substrate chucking and bias compensation module 522 discussed above. The substrate chucking and bias compensation module 522 is further coupled to stray capacitance 538. The substrate chucking and bias compensation module 522 is a circuit that includes a diode 524 coupled in series to a resistor 526, and a DC voltage source 528, and a resistor 530 coupled in series to a capacitance 532 and ground 534. The diode 708 is a flyback diode for protecting the switch 706 and DC voltage source 710.

The plasma sheath 540 may be modeled (plasma sheath model) as a circuit comprising a sheath capacitance 542 coupled in parallel with a current source 544 and a diode 546 coupled to ground 548.

In use, and for the configuration shown in FIG. 7A, the DC voltage source 710 together with the resistor 712 acts as an active knob for controlling the slope of the voltage waveform in the ion current stage. The switch 706 can be controlled by TTL signal 704 synchronized with the main pulser 502, as shown in the plot of FIG. 5B. The switch 706 can be closed before the voltage of the main pulser 502 goes up to enter the sheath collapse stage. The switch 512 can be kept closed during the sheath collapse stage. After the voltage of the main pulser 502 goes down to enter the ion current stage, the switch 706 can be opened such that the DC voltage source 710 is functioning to modulate IEDF in the ion current stage. The optional capacitance 714 can be used to adjust the sensitivity of the substrate voltage waveform to the DC voltage source 710. The control mechanism of FIG. 7A is similar to the control mechanism of FIG. 6A. One difference is that the control circuit of FIG. 7A is shown in FIG. 6C, described above, and the control circuit of FIG. 6A is shown in FIG. 6B.

Figure 8:
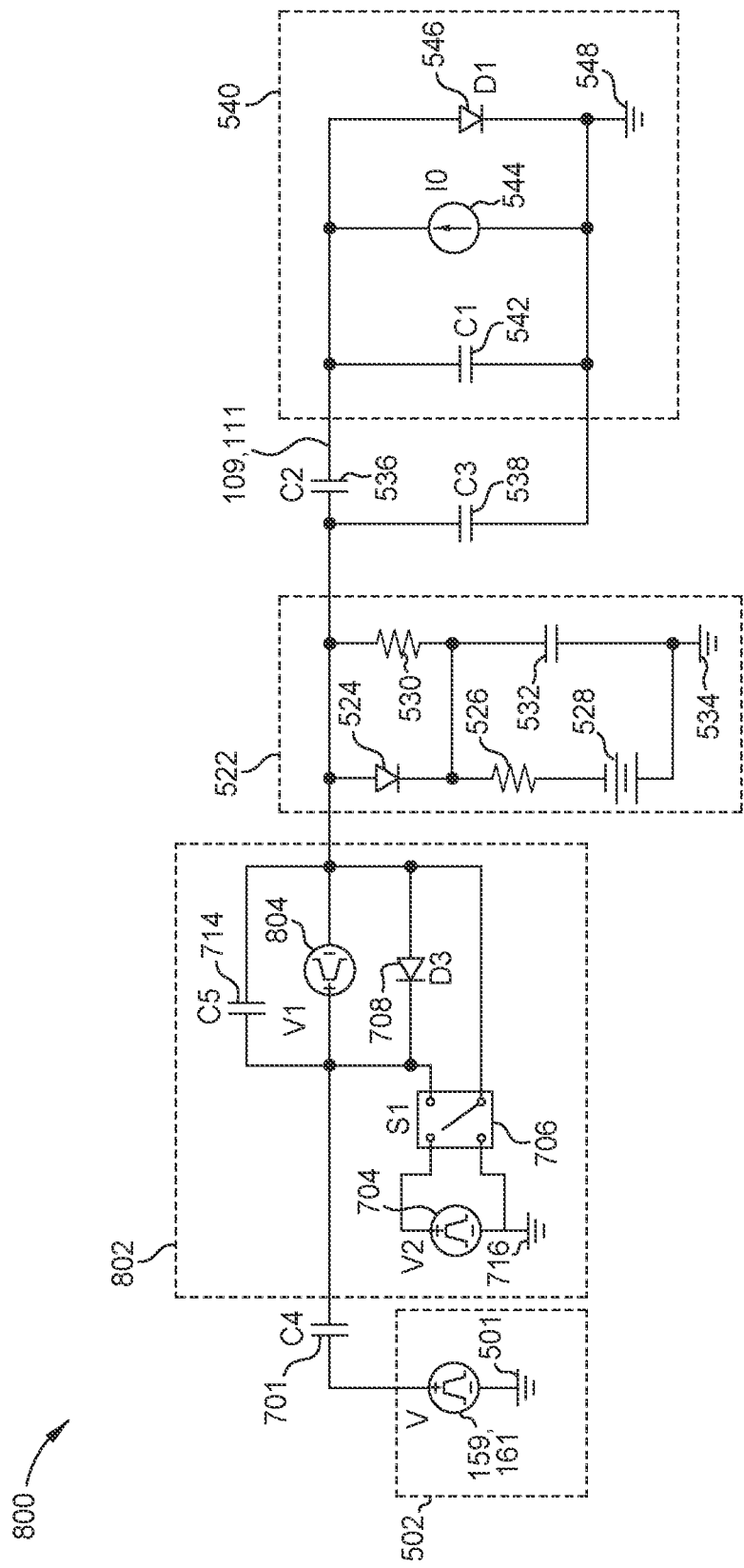
FIG. 8 is an example schematic circuit diagram illustrating the IEDF width control circuit for driving the electrodes of the substrate support assembly according to at least one embodiment of the present disclosure.

FIG. 8 is a schematic circuit diagram illustrating an embodiment of an edge ring voltage control circuit/substrate voltage control circuit 800 for driving the substrate electrode 109 and/or the edge ring electrode 111 of substrate support assembly 104. Circuit 800 includes a main pulser 502 to reset the substrate voltage (corresponding to the voltage droop in FIG. 3A) at the beginning of each ion current phase. The main pulser 502 can be the first or second shaped DC voltage source 159, 161 coupled to ground 501. The main pulser 502 is coupled to an IEDF width control module 802 (e.g., second power module in FIG. 4C) either directly or through a capacitance 701.

The IEDF width control module 802 may be modeled as a circuit comprising a TTL signal 704 coupled in parallel with a switch 706. The TTL signal 704 is also coupled in series with ground 716. Switch 706 is coupled in parallel to diode 708, a third shaped DC pulse voltage source 804, and an optional capacitance 714. The IEDF width control module 802 is coupled to a chamber capacitance 536. The capacitance 536 can be, for example, the impedance between the substrate electrode 109 and the substrate, or between the edge ring electrode 111 and the edge ring. In some embodiments, the IEDF width control module 802 is also coupled to the substrate chucking and bias compensation module 522 discussed above. The substrate chucking and bias compensation module 522 is a circuit that includes a diode 524 coupled in series to a resistor 526, a DC voltage source 528, and a resistor 530 coupled in series to a capacitance 532 and ground 534. The diode 708 is a flyback diode for protecting the switch and the third shaped DC pulse voltage source 804.

The substrate chucking and bias compensation module 522 is further coupled to chamber capacitance 536. The plasma sheath 540 may be modeled (plasma sheath model) as a circuit comprising a sheath capacitance 542 coupled in parallel with a current source 544 and a diode 546 coupled to ground 548.

In use, and for the configuration shown in FIG. 8, the third shaped DC pulse voltage source 804 acts as the active knob for controlling the slope of the voltage waveform in the ion current stage, as opposed to the configuration of FIG. 7A, where the DC voltage source 710 together with the resistor 712 acts as an active knob for controlling the slope of the voltage waveform in the ion current stage. The switch 706 can be controlled by TTL signal 704 synchronized with the main pulser 502, as shown in the plot of FIG. 5B. The switch 706 can be closed before the voltage of the main pulser 502 goes up to enter the sheath collapse stage. The switch 706 is kept closed during the sheath collapse stage. After the voltage of the main pulser 502 goes down to enter the ion current stage, the switch 706 can be opened such that the third shaped DC pulse voltage source 804 is functioning to modulate IEDF in the ion current stage. The optional capacitance 714 can be used to adjust the sensitivity of the substrate voltage waveform to the third shaped DC pulse voltage source 804. The control mechanism of FIG. 8 is similar to that of FIG. 5A. One difference is that the control circuit of FIG. 8 is shown in FIG. 5D, described above, and the control circuit of FIG. 5A is shown in FIG. 5C.

For the configurations shown in FIGS. 5A, 6A, 7, and 8, it is contemplated that the substrate chucking and bias compensation module can be connected to the circuit in any suitable manner without departing from the scope of the embodiments described herein. It is also contemplated that the substrate chucking and bias compensation module can include additional or different components without departing from the scope of the embodiments described herein.

Figure 9:
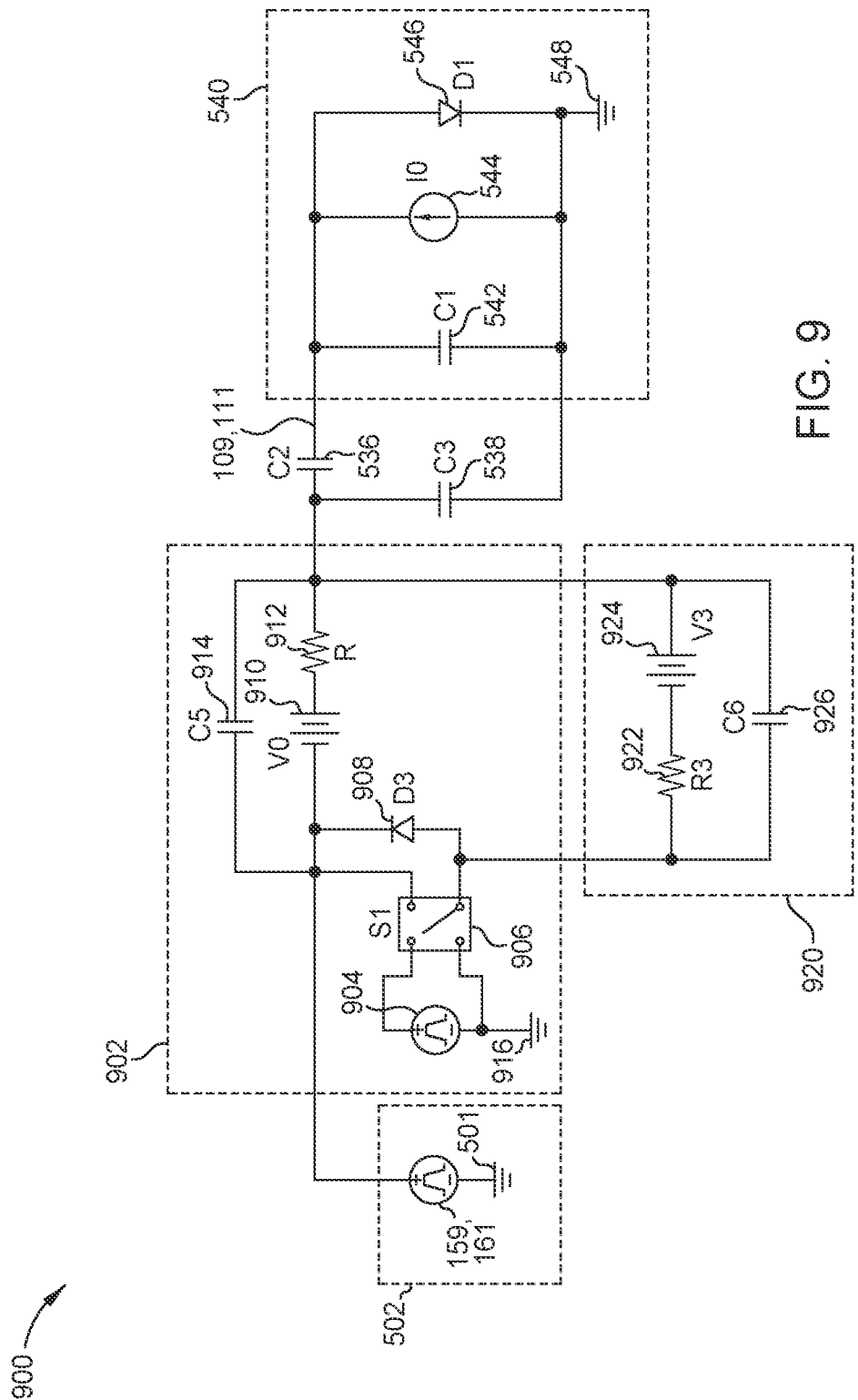
FIG. 9 is an example schematic circuit diagram illustrating the IEDF width control circuit for driving the electrodes of the substrate support assembly according to at least one embodiment of the present disclosure.

FIG. 9 is a schematic circuit diagram illustrating an embodiment of an edge ring voltage control circuit/substrate voltage control circuit 900 for driving the substrate electrode 109 and/or the edge ring electrode 111 of substrate support assembly 104. Circuit 900 includes a main pulser 502 to reset the substrate voltage (corresponding to the voltage droop in FIG. 3A) at the beginning of each ion current phase. The main pulser 502 can be the first or second shaped DC pulse voltage source 159, 161 coupled to ground 501. The main pulser 502 is coupled to an IEDF width control module 902 (e.g., second power module in FIG. 4D).

The IEDF width control module 902 may be modeled as a circuit comprising a TTL signal 904 coupled in parallel with a switch 906. The TTL signal 904 is also coupled in series with ground 916. Switch 906 is coupled in parallel to diode 908. The combination of the TTL signal 904, the switch 906, and the diode 908 controls whether the substrate chucking and bias compensation module 920 is connected to another part of the circuit. The substrate chucking and bias compensation module 920 is a circuit that includes a capacitance 926 coupled in parallel to resistor 922 and a DC voltage source 924. The substrate chucking and bias compensation module 920 is coupled in series with the assembly of the TTL signal 904, the switch 906, and the diode 908. The substrate chucking and bias compensation module 920 and the switch 906, as a whole, is coupled in parallel to a DC voltage source 910 in series with a resistor 912, and also in parallel to an optional capacitor 914. The diode 908 is a flyback diode for protecting the switch 906 and DC voltage sources 910 and 924.

A capacitance 536 may exist between stray capacitance 538 and the plasma sheath 540, which can be, for example, the impedance between the substrate electrode 109 and the substrate, or between the edge ring electrode 111 and the edge ring. Both the IEDF width control module 902 and the substrate chucking and bias compensation module 920 are coupled to either the substrate electrode 109 and/or the edge ring electrode 111. The IEDF width control module 902 is also coupled to stray capacitance 538. The plasma sheath 540 may be modeled (plasma sheath model) as a circuit comprising a sheath capacitance 542 coupled in parallel with a current source 544 and a diode 546 coupled to ground 548.

In use, and for the configuration illustrated in FIG. 9, the DC voltage source 910 together with the resistor 912 acts as an active knob for controlling the slope of the voltage waveform in the ion current stage. The switch 906 can be controlled by TTL signal 904 synchronized with the main pulser 502, as shown in FIG. 5B. The switch 906 can be closed before the voltage of the main pulser 502 goes up to enter the sheath collapse stage. The switch 512 can be kept closed during the sheath collapse stage such that the substrate chucking and bias compensation module 920 is connected to another part of the circuit and resets the substrate chucking voltage to a setpoint. After the voltage of the main pulser 502 goes down to enter the ion current stage, the switch 906 can be opened such that the DC voltage source 910 is functioning to modulate IEDF in the ion current stage. The optional capacitor 914 can be used to adjust the sensitivity of the substrate voltage waveform to the DC voltage source 910. The control mechanism of FIG. 9 is similar to that shown in FIG. 6B described above. One difference is the capacitor C4 being removed.

Figure 10:
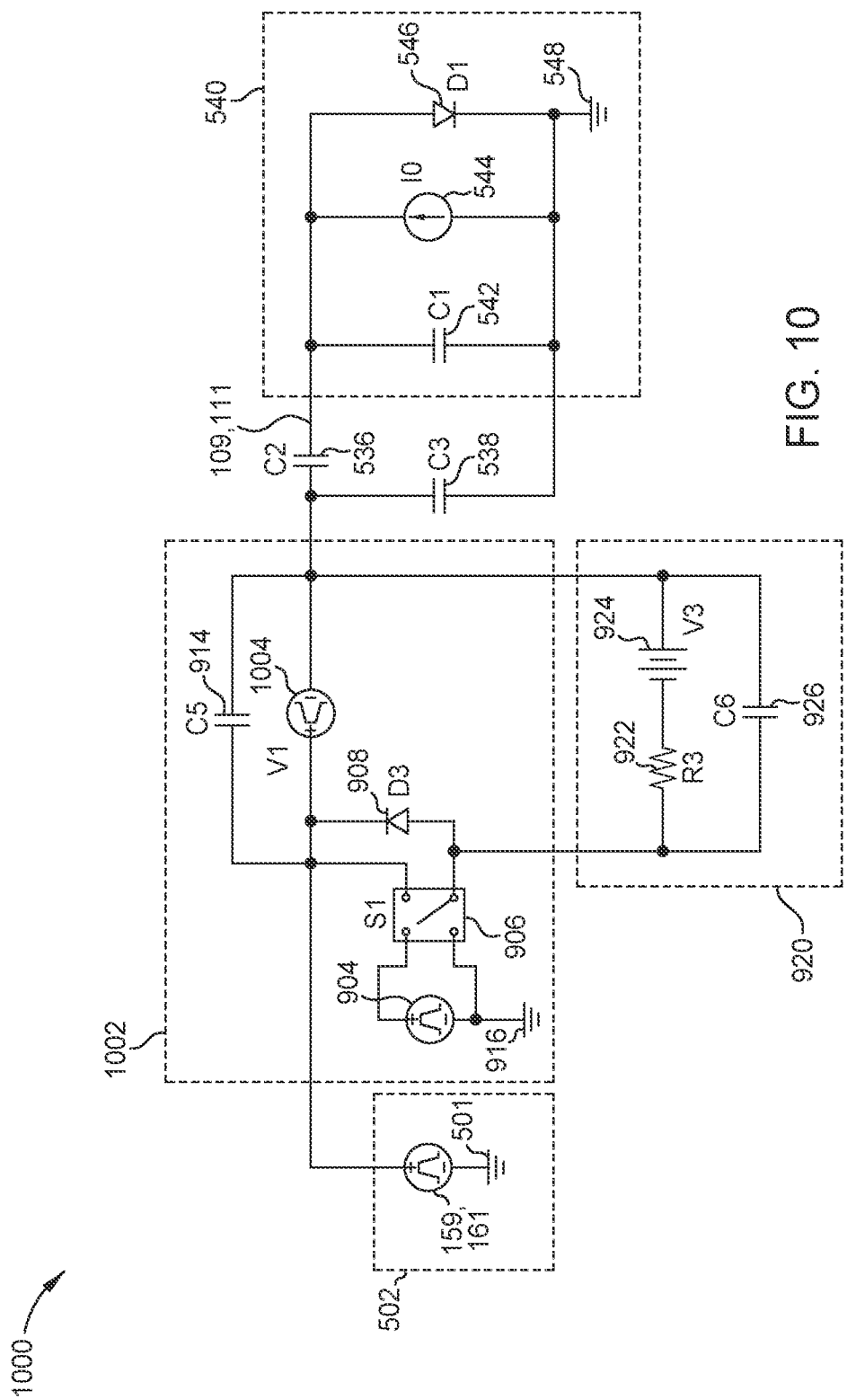
FIG. 10 is an example schematic circuit diagram illustrating the IEDF width control circuit for driving the electrodes of the substrate support assembly according to at least one embodiment of the present disclosure.

FIG. 10 is a schematic circuit diagram illustrating an embodiment of an edge ring voltage control circuit/substrate voltage control circuit 1000 for driving the electrodes 109, 111 of the substrate support assembly 104. Circuit 1000 includes a main pulser 502 to reset the substrate voltage (corresponding to the voltage droop in FIG. 3A) at the beginning of each ion current phase. The main pulser 502 can be the first or second shaped DC pulse voltage sources 159, 161 coupled to ground 501. The main pulser 502 is coupled to an IEDF width control module 1002 (e.g., second power module in FIG. 4D).

The IEDF width control module 1002 may be modeled as a circuit comprising a TTL signal 904 coupled in parallel with a switch 906. The TTL signal 904 is also coupled in series with ground 916. Switch 906 is coupled in parallel to diode 908. The combination of the TTL signal 904, the switch 906, and the diode 908 controls whether the substrate chucking and bias compensation module is connected to another part of the circuit. The substrate chucking and bias compensation module 920 is a circuit that includes a capacitance 926 coupled in parallel to resistor 922 and a DC voltage source 924. The diode 908 is a flyback diode for protecting the switch, the DC voltage source 910, and the DC voltage source 924. The substrate chucking and bias compensation module 920 is coupled in series with the assembly of the TTL signal 904, the switch 906, and the diode 908. The substrate chucking and bias compensation module 920 and the switch 906, as a whole, is coupled in parallel to a shaped DC pulse voltage source 1004, and also in parallel to an optional capacitor 914.

A capacitance 536 may exist between stray capacitance 538 and the plasma sheath 540, which can be, for example, the impedance between the substrate electrode 109 and the substrate, or between the edge ring electrode 111 and the edge ring. Both the IEDF width control module 1002 and the substrate chucking and bias compensation module 920 are coupled to either the substrate electrode 109 and/or the edge ring electrode 111. The IEDF width control module 1002 is also coupled to stray capacitance 538. The plasma sheath 540 may be modeled (plasma sheath model) as a circuit comprising a sheath capacitance 542 coupled in parallel with a current source 544 and a diode 546 coupled to ground 548.

In use, and for the configuration illustrated in FIG. 10, the shaped DC pulse voltage source 1004 acts as the active knob for controlling the slope of the voltage waveform in the ion current stage, as opposed to the configuration of FIG. 9, where the DC voltage source 910 together with the resistor 912 acts as an active knob for controlling the slope of the voltage waveform in the ion current stage. The switch 906 can be controlled by TTL signal 904 synchronized with the main pulser 502, as shown in the plot of FIG. 5B. The switch 906 can be closed before the voltage of the main pulser 502 goes up to enter the sheath collapse stage. The switch 512 can be kept closed during the sheath collapse stage such that the substrate chucking and bias compensation module is connected to another part of the circuit and resets the substrate chucking voltage to a setpoint. After the voltage of the main pulser 502 goes down to enter the ion current stage, the switch 906 can be opened such that the DC voltage source 910 is functioning to modulate IEDF in the ion current stage. The optional capacitor 914 can be used to adjust the sensitivity of the substrate voltage waveform to the shaped DC pulse voltage source 1004.

The control mechanism of FIG. 10 is similar to that of FIG. 5A. One difference is the capacitor C4 being removed. Another difference is the output voltage of the shaped DC pulse voltage source 1004 in the sheath collapse stage is held at the output voltage of the substrate chucking and bias compensation module 920 instead of zero, as the trace 582 (positive chucking voltage) and trace 586 (negative chucking voltage) in FIG. 5E.

Example Method

Figure 11:
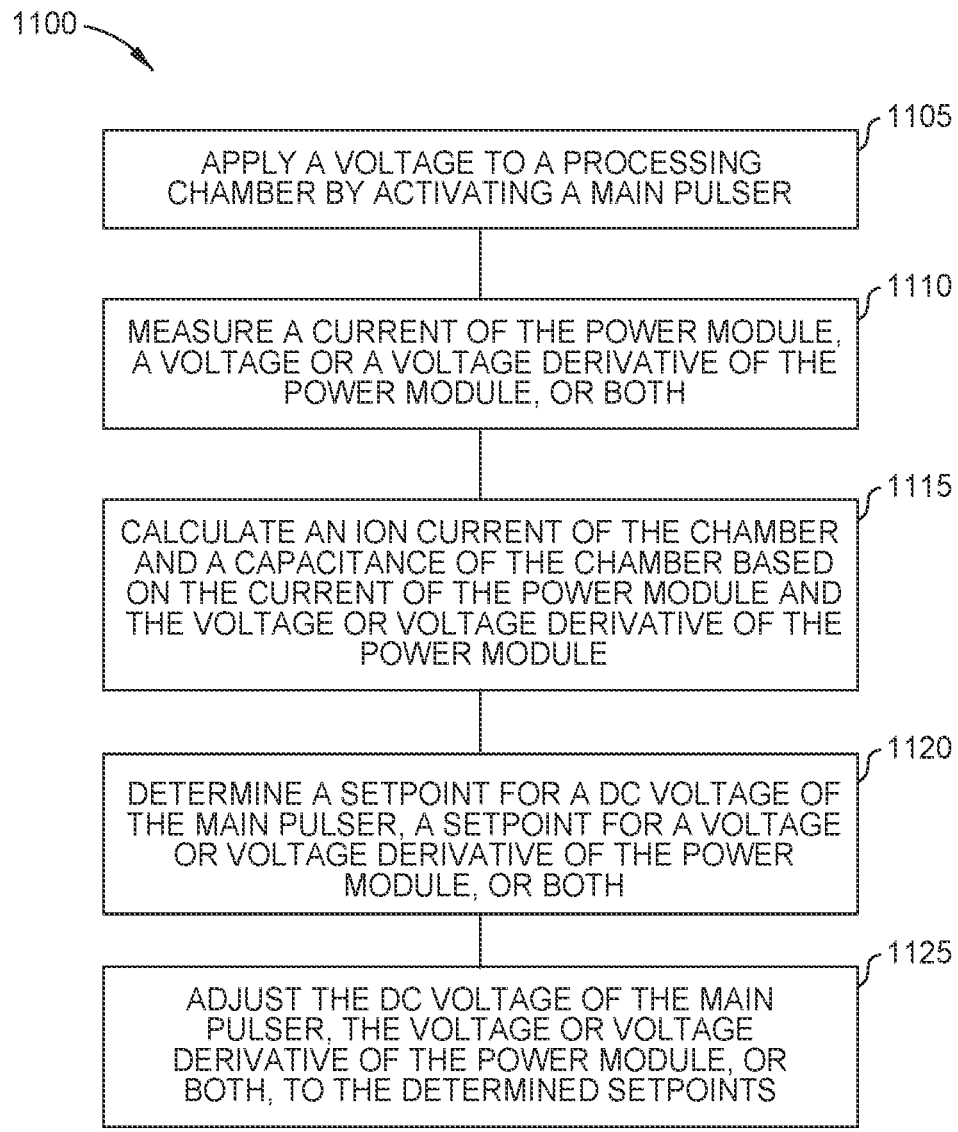
FIG. 11 is a flowchart of a method of controlling IEDF width according to at least one embodiment of the present disclosure.

FIG. 11 is a flowchart of a method 1100 of controlling the IEDF width using the edge ring IEDF width control circuit 155 and/or the substrate IEDF width control circuit 158 according to at least one embodiment of the present disclosure. The method 1100 can be implemented using one or more of the circuit configurations illustrated in FIGS. 5-10. The method 1100 also provides a method of operating the processing chamber 100 or processing chamber 200.

The method 1100 begins with applying, or otherwise introducing, a voltage to a suitable processing chamber by activating, or turning on, a main pulser (e.g., main pulser 502) coupled to a power module (e.g., the IEDF width control module). Here, the voltage is introduced to the substrate electrode, e.g., substrate electrode 109, and/or the edge ring electrode, e.g., edge ring electrode 111. The bias voltage on the substrate electrode and/or the edge ring electrode develops in the ion current stage and accelerates ions at an energy of, e.g., the product of the sheath voltage multiplied by the charge of the ions. In the collisionless sheath model, most of the ions can reach this maximum energy when bombarding the substrate electrode and/or edge ring electrode. However, due to, e.g., the ion current depositing positive charge on the substrate electrode and/or edge ring electrode, the voltage of the substrate electrode and/or edge ring electrode increases over time, reducing the sheath voltage and resulting in a spread of the ion energy.

At operation 1110, a current of the power module (e.g., the IEDF width control module), and/or a voltage or a voltage derivative of the IEDF width control module are measured under two or more conditions to determine the sheath capacitance C1 and/or the ion current I0. Here the current measured can be the current I4, which is the current through the capacitor C4 in FIGS. 5A, 6A, 7 and 8. Additionally, or alternatively, the current measured can be the output current of the main pulser in FIGS. 9 and 10. The voltage derivative can be dV3/dt. The measurements can be performed in the ion current stage. The two or more conditions can be achieved by setting the active knob (e.g., the DC voltage source V0 and/or the shaped DC pulse voltage source dV1/dt) in the IEDF width control module to two different values.

As an example, and for the configurations of FIGS. 5, 8, and 10, the shaped DC pulse voltage source can be set to any two different slopes dV1/dt in the ion current stage. As another example, and for the configurations of FIGS. 6, 7, and 9, the DC voltage V0 can be increased gradually while monitoring I4 up to a point when I4 is affected by the DC voltage V0. This DC voltage is the threshold voltage Vth. At least one of the two setpoints for the DC voltage source V0 is larger than Vth. That is, measuring the current of the IEDF width control module, the voltage or voltage derivative of the IEDF width control module, or both, includes setting the DC voltage source, the shaped DC pulse voltage source, or both to a first value; and setting the DC voltage source, the shaped DC pulse voltage source, or both to a second value.

Figure 7:
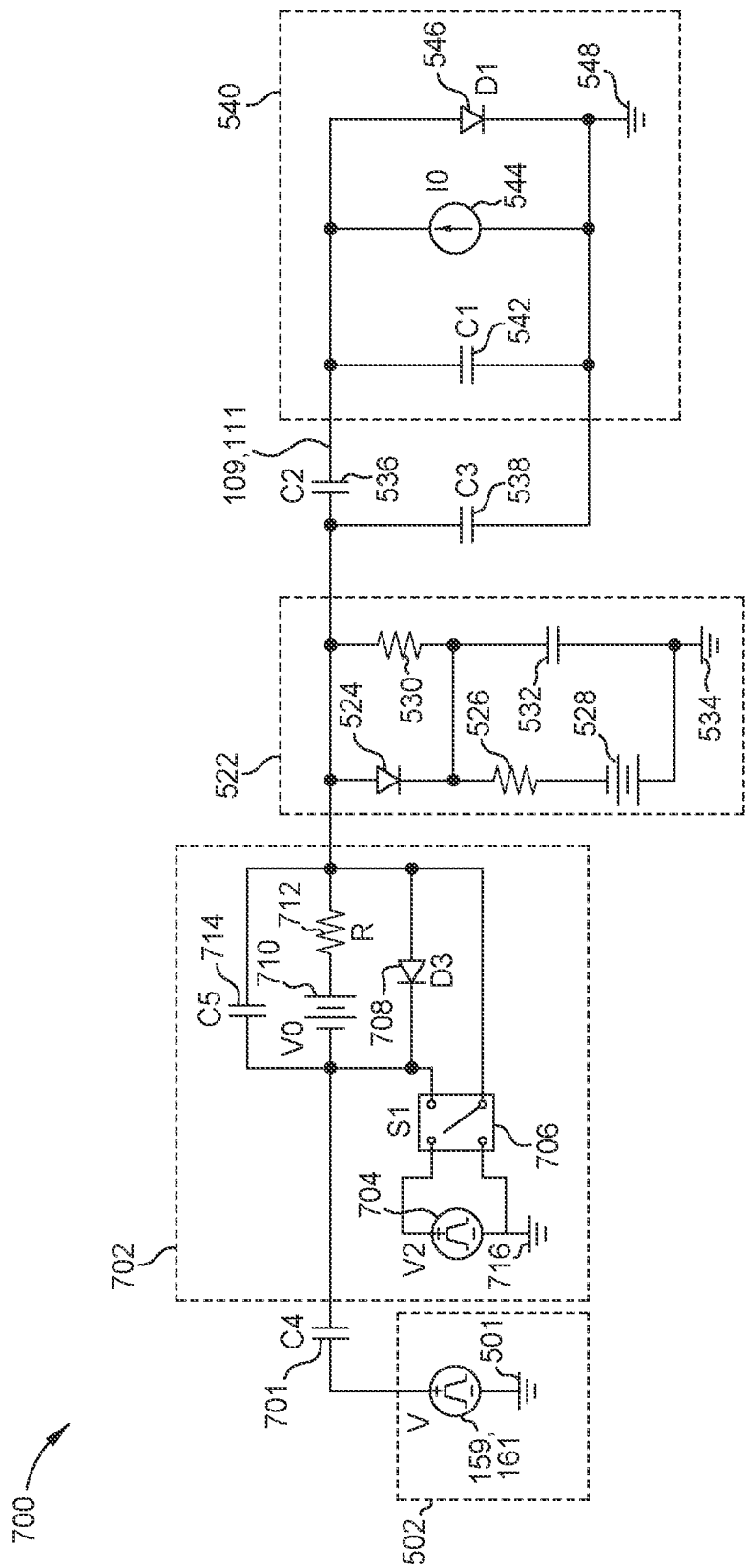
FIG. 7A is an example schematic circuit diagram illustrating the IEDF width control circuit for driving the electrodes of the substrate support assembly according to at least one embodiment of the present disclosure.

At operation 1115, the ion current I0 and the sheath capacitance C1 are calculated based on equations (6) and (7) for the configurations of FIGS. 5, 8, and 10, or equations (19) and (20) for the configurations of FIGS. 6, 7, and 9. The input values for the calculations are: I3=C3*dV3/dt; I3'=C3*dV3'/dt; and I4, I4'. The values of C3 and C3' are known, and the values of dV3/dt, dV3'/dt, I4, and I4' are measured at operation 1110. As such, I3 and I3' can be calculated.

At operation 1120, a desired setpoint for a DC voltage (V0) of the main pulser, a desired setpoint for a voltage (V1) or a voltage derivative (dV1/dt) of the IEDF width control module, or both, are determined to achieve a targeted IEDF width (ΔV). This determination is based on, e.g., determining a desired setting of the IEDF width control module to achieve a user-specified ion energy distribution width (ΔV). The DC voltage (V0) of the main pulser and the slope (dV1/dt) of the shaped DC pulse voltage (V1), can be determined from equations (23) and (9), respectively. At operation 1125, the DC voltage (V0) and/or the voltage (V1) or voltage derivative (dV1/dt) of the IEDF width control module are adjusted to the determined setpoints.

In contrast to conventional processes for controlling the IEDF, the method described herein is free of looping to determine the desired setpoint of the IEDF width control module. However, and in some embodiments, looping can be used to determine the desired set point. In such embodiments, the controller can monitor I4 and V3 in the ion current stage to detect any changes in the plasma conditions and to adjust the setpoint of the IEDF width control module accordingly.

The methods and apparatus, e.g., circuits, described herein enable control over the shape (e.g., narrow, or adjustable width) of the waveform of a pulsed DC substrate voltage. Embodiments described herein further enable, e.g., control over the ion energy distribution, including monoenergetic ion acceleration.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group consisting of," or "is" preceding the recitation of the composition, element, or elements and vice versa.

While the foregoing is directed to examples of the present disclosure, other and further examples of the disclosure may be devised without departing from the basic scope thereof, and the scope thereof is determined by the claims that follow.

What is claimed is:

1. A substrate support, comprising:
a substrate electrode for applying a substrate voltage to a substrate, the substrate electrode coupled to a power module, the power module configured to actively control an energy distribution function width of ions reaching the substrate, the power module comprising a voltage source, a current source, or a combination thereof; and
a substrate voltage control circuit coupled to the substrate electrode, the substrate voltage control circuit comprising a main pulser coupled to a current return path, the current return path coupled to the power module and to a processing chamber.

2. The substrate support of claim 1, wherein the power module comprises a transistor-transistor logic signal source coupled in parallel with a switch, and a shaped DC pulse voltage source.

3. The substrate support of claim 2, wherein the shaped DC pulse voltage source controls a slope of voltage waveform of the substrate voltage.

4. The substrate support of claim 1, wherein the power module comprises a transistor-transistor logic signal source coupled in parallel with a switch and a diode.

5. The substrate support of claim 1, wherein the power module comprises a transistor-transistor logic signal source coupled in parallel with a DC voltage source.

6. The substrate support of claim 5, wherein the DC voltage source coupled in series to a resistor.

7. The substrate support of claim 6, wherein the DC voltage source coupled in series to the resistor controls a slope of voltage waveform of the substrate voltage.

8. The substrate support of claim 1, wherein the power module comprises a transistor-transistor logic signal source coupled in parallel with a switch, a diode, and a DC voltage source.

9. A substrate support, comprising:
a substrate electrode for applying a substrate voltage to a substrate; and
a substrate voltage control circuit coupled to the substrate electrode, wherein:
the substrate electrode is coupled to a power module configured to actively control an energy distribution function width of ions reaching the substrate; and
the substrate voltage control circuit comprises a main pulser coupled to the power module, the power module coupled to a processing chamber, the power module comprising a voltage source, a current source, or a combination thereof.

10. The substrate support of claim 9, wherein a blocking capacitance is coupled to both the main pulser and the power module.

11. The substrate support of claim 9, wherein the power module comprises a transistor-transistor logic signal source coupled in parallel with a switch, the switch coupled in parallel to a diode and a DC voltage source, the DC voltage source coupled in series to a resistor.

12. The substrate support of claim 11, wherein the DC voltage source coupled in series to the resistor controls a slope of voltage waveform of the substrate voltage.

13. The substrate support of claim 9, wherein the power module comprises a transistor-transistor logic signal source coupled in parallel with a switch, the switch coupled in parallel to a diode and a shaped DC pulse voltage source.

14. The substrate support of claim 13, wherein the shaped DC pulse voltage source controls a slope of voltage waveform of the substrate voltage.

15. A substrate support, comprising:
a substrate electrode for applying a substrate voltage to a substrate; and
a substrate voltage control circuit coupled to the substrate electrode, wherein:
the substrate electrode is coupled to a power module configured to actively control an energy distribution function width of ions reaching the substrate; and
the substrate voltage control circuit comprises:
a main pulser coupled to the power module, the power module coupled to a processing chamber, the power module is in parallel with a substrate chucking and bias compensation module, and the power module comprising a voltage source, a current source, or a combination thereof.

16. The substrate support of claim 15, wherein a blocking capacitance is coupled to both the main pulser and the power module.

17. The substrate support of claim 15, wherein the power module comprises a transistor-transistor logic signal source coupled in parallel with a switch, the switch coupled in parallel to a diode and a DC voltage source, the DC voltage source coupled in series to a resistor.

18. The substrate support of claim 17, wherein the DC voltage source coupled in series to the resistor controls a slope of voltage waveform of the substrate voltage.

19. The substrate support of claim 15, wherein the power module comprises a transistor-transistor logic signal source coupled in parallel with a switch, the switch coupled in parallel to a diode and a shaped DC pulse voltage source.

20. The substrate support of claim 19, wherein the shaped DC pulse voltage source controls a slope of voltage waveform of the substrate voltage.

21. The substrate support of claim 1, wherein the power module further comprises a diode.

* * * * *